United States Patent
Baldauf et al.

(10) Patent No.: US 9,484,407 B2
(45) Date of Patent: Nov. 1, 2016

(54) METHODS OF FORMING A NANOWIRE TRANSISTOR DEVICE

(71) Applicant: GLOBALFOUNDRIES Inc., Grand Cayman (KY)

(72) Inventors: Tim Baldauf, Dresden (DE); Stefan Flachowsky, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/469,741

(22) Filed: Aug. 27, 2014

(65) Prior Publication Data

US 2015/0129964 A1 May 14, 2015

(30) Foreign Application Priority Data

Nov. 14, 2013 (DE) .................. 10 2013 223 263

(51) Int. Cl.
| | |
|---|---|
| *H01L 21/02* | (2006.01) |
| *H01L 29/06* | (2006.01) |
| *H01L 29/66* | (2006.01) |
| *H01L 29/78* | (2006.01) |
| *H01L 29/10* | (2006.01) |
| *H01L 29/165* | (2006.01) |
| *H01L 29/775* | (2006.01) |
| *B82Y 10/00* | (2011.01) |
| *B82Y 40/00* | (2011.01) |
| *H01L 29/778* | (2006.01) |

(52) U.S. Cl.
CPC ............ *H01L 29/068* (2013.01); *B82Y 10/00* (2013.01); *B82Y 40/00* (2013.01); *H01L 29/1054* (2013.01); *H01L 29/165* (2013.01); *H01L 29/66439* (2013.01); *H01L 29/66666* (2013.01); *H01L 29/775* (2013.01); *H01L 29/7827* (2013.01); *H01L 21/0262* (2013.01); *H01L 21/02532* (2013.01); *H01L 21/02639* (2013.01); *H01L 29/0676* (2013.01); *H01L 29/66431* (2013.01); *H01L 29/7781* (2013.01)

(58) Field of Classification Search
CPC .................... H01L 21/02603; H01L 21/0665; H01L 21/0669
See application file for complete search history.

(56) References Cited

U.S. PATENT DOCUMENTS

| | | | |
|---|---|---|---|
| 2010/0176459 A1 | 7/2010 | Wernersson et al. | |
| 2011/0018065 A1 | 1/2011 | Curatola et al. | |
| 2011/0139209 A1* | 6/2011 | Lang ..................... | B82Y 10/00 136/243 |
| 2014/0197377 A1* | 7/2014 | Kim ...................... | H01L 27/092 257/29 |
| 2015/0076608 A1* | 3/2015 | Cheng ..................... | H01L 21/28 257/365 |

FOREIGN PATENT DOCUMENTS

DE      112010002324 T5      6/2012

OTHER PUBLICATIONS

Translation of Official Communication from German Patent Application No. 10 2013 223 263.2 dated Mar. 5, 2014.

* cited by examiner

*Primary Examiner* — Jae Lee
(74) *Attorney, Agent, or Firm* — Amerson Law Firm, PLLC

(57) ABSTRACT

A semiconductor device is provided including a semiconductor substrate and a nanowire formed over the semiconductor substrate and wherein the nanowire includes a first layer exhibiting tensile stress and a second layer exhibiting compressive stress.

19 Claims, 18 Drawing Sheets

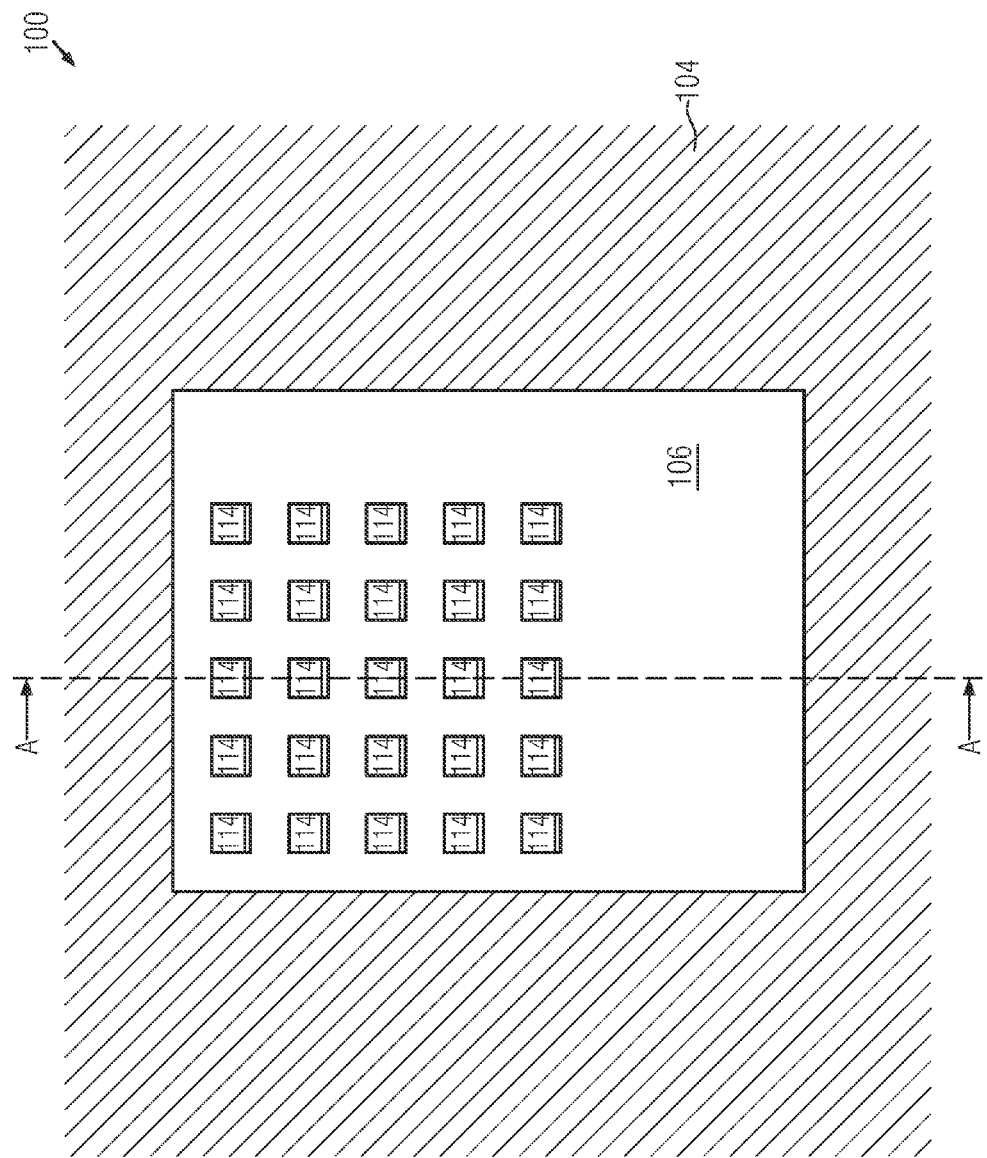
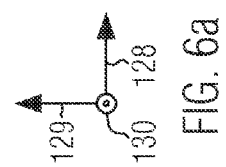
FIG. 6a

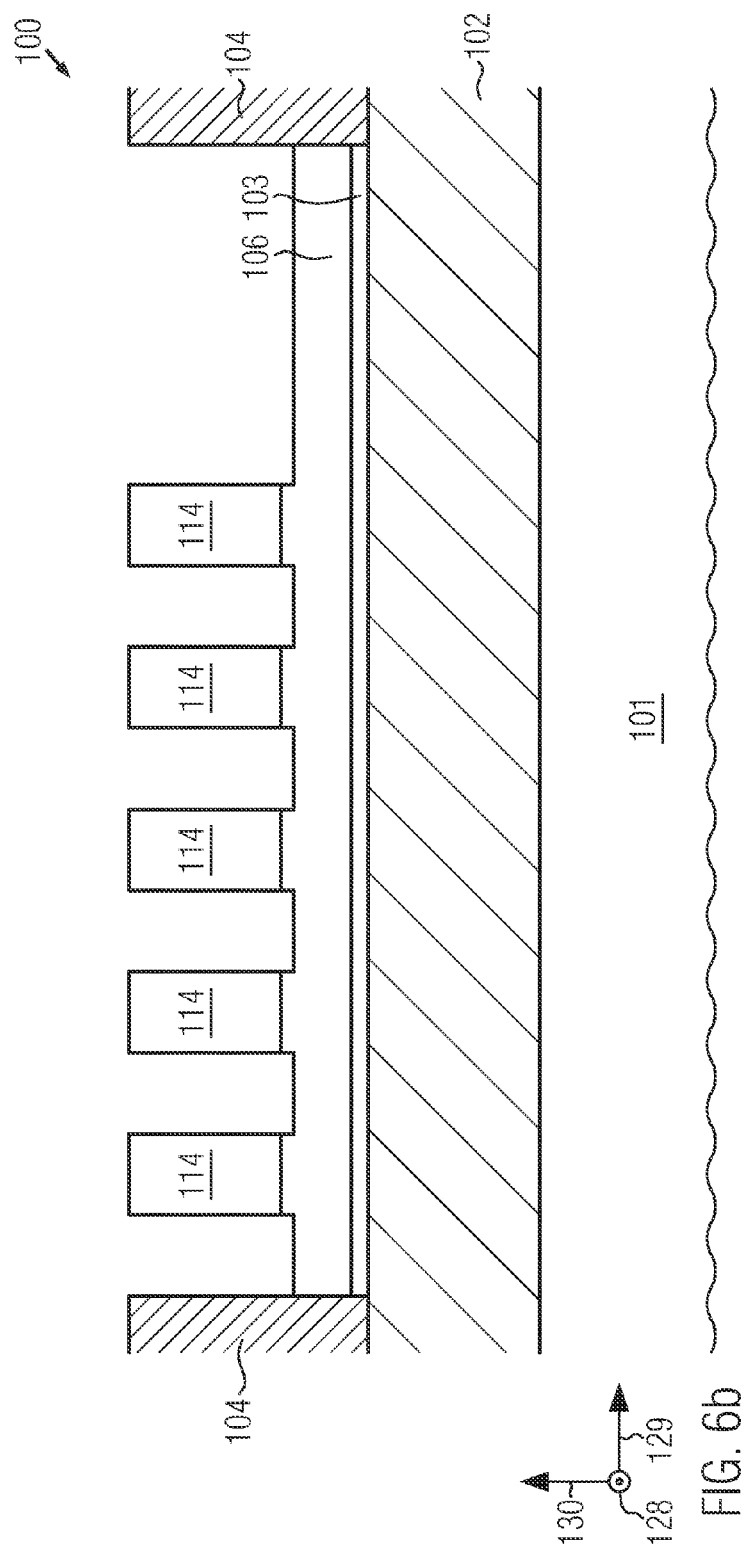

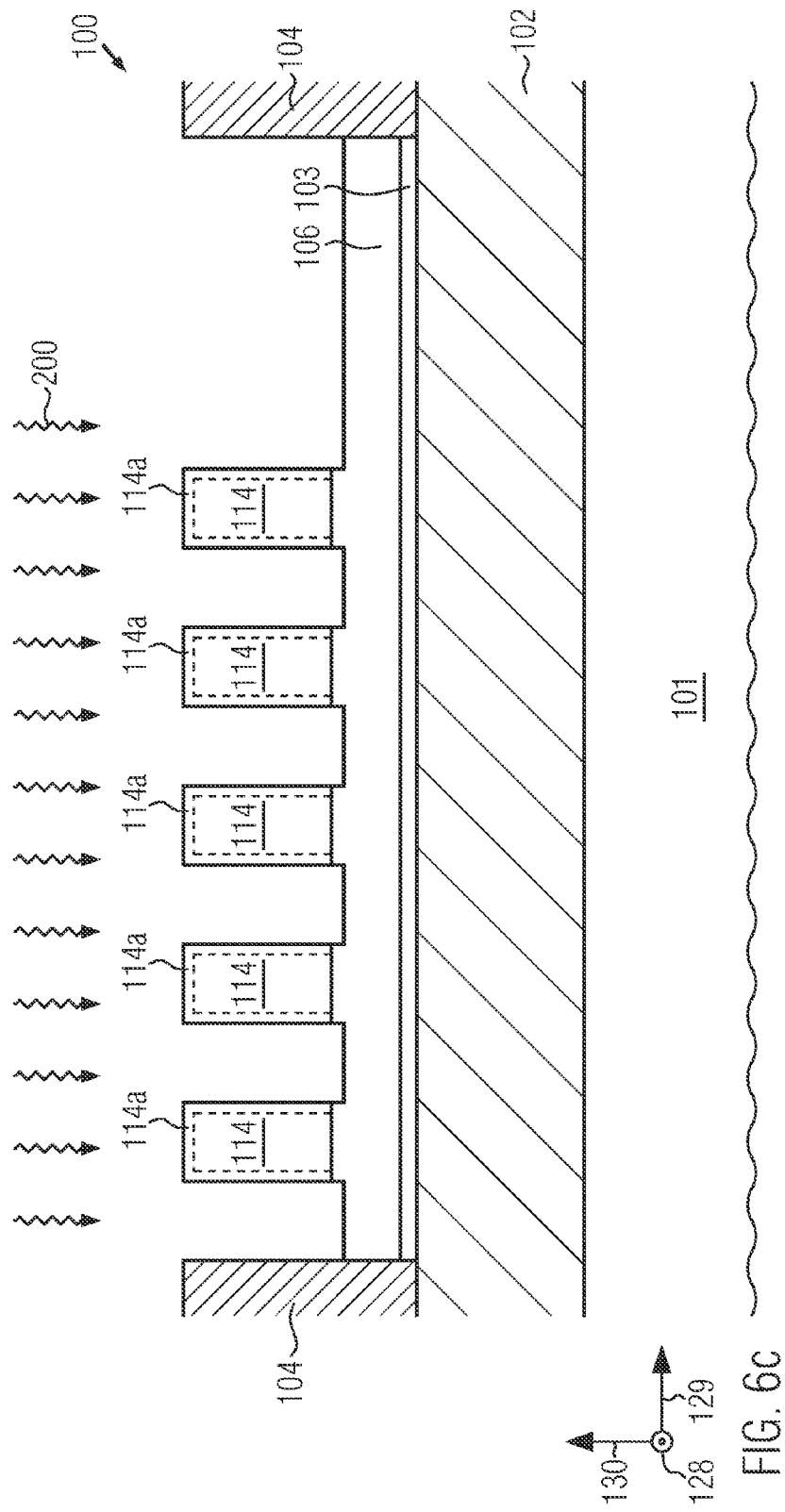

METHODS OF FORMING A NANOWIRE TRANSISTOR DEVICE

BACKGROUND OF THE INVENTION

1. Field of the Invention

Generally, the present disclosure relates to the field of the manufacture of integrated circuits and semiconductor devices, and, more particularly, to FETs comprising nanowire gate structures.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout. In a wide variety of electronic circuits, field effect transistors represent one important type of circuit element that substantially determines performance of the integrated circuits. Generally, a plurality of process technologies are currently practiced for forming field effect transistors, wherein, for many types of complex circuitry, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer.

A field effect transistor, irrespective of whether an N-channel transistor or a P-channel transistor is considered, comprises so-called PN junctions that are formed by an interface of highly doped drain and source regions with an inversely or weakly doped channel region disposed between the drain region and the source region. The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on, among other things, the concentration of the dopants, the mobility of the majority charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially determines the performance of the MOS transistors. Thus, the reduction of the channel length, and associated therewith the reduction of the channel resistivity, renders the channel length a dominant design criteria for accomplishing an increase in the operating speed of the integrated circuits.

The shrinkage of the transistor dimensions, however, involves a plurality of issues associated therewith that have to be addressed so as to not unduly offset the advantages obtained by steadily decreasing the channel length of MOS transistors. One issue associated with reduced gate lengths is the occurrence of so-called short channel effects, which may result in a reduced controllability of the channel conductivity. Short channel effects may be countered by certain design techniques, some of which, however, may be accompanied by a reduction of the channel conductivity, thereby partially offsetting the advantages obtained by the reduction of critical dimensions.

In view of this situation, it has been proposed to enhance device performance of the transistor elements not only by reducing the transistor dimensions but also by increasing the charge carrier mobility in the channel region for a given channel length, thereby increasing the drive current capability and thus transistor performance. For example, the lattice structure in the channel region may be modified, for instance, by creating tensile or compressive strain therein, which results in a modified mobility for electrons and holes, respectively. For example, creating tensile strain in the channel region of a silicon layer having a standard crystallographic configuration may increase the mobility of electrons, which, in turn, may directly translate into a corresponding increase of the conductivity of N-type transistors. On the other hand, compressive strain in the channel region may increase the mobility of holes, thereby providing the potential for enhancing the performance of P-type transistors.

According to an alternative approach and in contrast to a FET (field effect transistor), which has a planar structure, a so-called FinFET device has been introduced that has a three-dimensional structure. More specifically, in a FinFET, a generally vertically positioned fin-shaped active area is formed and a gate electrode encloses both sides and an upper surface of the fin-shaped active area to form a tri-gate structure so as to use a channel having a three-dimensional structure instead of a planar structure. In some cases, an insulating cap layer, e.g., silicon nitride, is positioned at the top of the fin and the FinFET device only has a dual-gate structure. Thus, an electric voltage applied to the gate electrode of a FinFET or tri-gate transistor, respectively, is provided on two or three sides of the channel region, respectively, which may improve the controllability of the channel region. In a FinFET, the junction capacitance at the drain region of the device is greatly reduced, which tends to reduce at least some short channel effects. However, similar to planar transistors, in FinFET and tri-gate transistors, the source, channel and drain regions are arranged along a horizontal direction of the substrate, requiring a relatively large amount of space for providing electrical contacts to the source and drain regions and for the gate length.

Device manufacturers are under constant pressure to produce integrated circuit products with increased performance and lower production costs relative to previous device generations. Thus, device designers spend a great amount of time and effort to maximize device performance, while seeking ways to reduce manufacturing costs and improve manufacturing reliability. As it relates to 3D devices, device designers have spent many years and employed a variety of techniques in an effort to improve the performance capability and reliability of such devices.

In view of the situation described, the present disclosure provides methods of manufacturing semiconductor devices and semiconductor devices that allow overcoming or at least reducing the problems mentioned above.

In particular, the present disclosure provides methods that may be employed for forming field effect transistors wherein the source, channel and drain regions are arranged along a vertical direction of a substrate on which the transistors are formed. This may allow a reduction of the extension of the field effect transistors in horizontal directions of the substrate, without requiring a scaling of the gate length of the transistors. Furthermore, methods are provided that may allow the formation of field effect transistors having an improved controllability of the channel characteristics as well as an improved carrier transport in the channel region and thereby an improved overall performance as compared to the art.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative semiconductor device provided herein includes a semiconductor substrate and a nanowire of a semiconductor material formed over the semiconductor substrate, wherein the nanowire comprises a first layer exhibiting tensile stress and a second layer exhibiting compressive stress. In particular, the semiconductor may comprise a FET comprising the nanowire. The nanowire may substantially vertically extend from the semiconductor substrate.

Moreover, a method of forming a semiconductor device is provided that includes providing a semiconductor substrate, forming a nanowire of a semiconductor material over the semiconductor substrate, removing part of the semiconductor material of the nanowire and, after removing the part of the semiconductor material, coating the remaining nanowire with a material exhibiting compressive or tensile stress. The semiconductor device may comprise a FET and the nanowire may comprise a channel of the FET.

The semiconductor substrate may be an SOI substrate comprising a first semiconductor layer formed on an oxide layer and the step of forming the nanowire may comprise the steps of: (a) forming a second doped semiconductor layer on the first semiconductor layer; (b) forming a third semiconductor layer on the second doped semiconductor layer, wherein the third doped semiconductor layer is undoped or inversely doped with respect to the second doped semiconductor layer; (c) forming a structure comprising (i) forming a dummy element of a first material on the third semiconductor layer and (ii) forming a plurality of spacer elements on both sides of the dummy element, wherein the plurality of spacer elements comprises spacer elements of the first material and spacer elements of a second material different from the first material in an alternating manner; (d) planarizing the formed structure, thereby obtaining a planarized dummy element and planarized spacer elements of the first and second material; (e) removing the planarized spacer elements of the second material; and (f) etching the portions of the third semiconductor layer exposed by the removed planarized spacer elements of the second material and part of the second doped semiconductor layer using the planarized dummy element and planarized spacer elements of the first material as an etch mask.

Alternatively, the semiconductor substrate may comprise a first doped semiconductor layer and forming the nanowire may comprise: (a) forming a second doped semiconductor layer on the first doped semiconductor layer, wherein the second doped semiconductor layer is inversely doped with respect to the first doped semiconductor layer; (b) forming a third doped semiconductor layer on the second doped semiconductor layer, wherein the third doped semiconductor layer is inversely doped with respect to the second doped semiconductor layer; (c) forming a structure comprising (i) forming a dummy element on the third doped semiconductor layer and (ii) forming a plurality of spacer elements on both sides of the dummy element, wherein the plurality of spacer elements comprises spacer elements of the first material and spacer elements of a second material different from the first material in an alternating manner; (d) planarizing the formed structure, thereby obtaining a planarized dummy element and planarized spacer elements of the first and second material; (e) removing the planarized spacer elements of the second material; and (f) etching the portions of the third doped semiconductor layer exposed by the removed planarized spacer elements of the second material and part of the second doped semiconductor layer using the planarized dummy element and planarized spacer elements of the first material as an etch mask.

BRIEF DESCRIPTION OF THE DRAWINGS

The disclosure may be understood by reference to the following description taken in conjunction with the accompanying drawings, in which like reference numerals identify like elements, and in which:

FIGS. 3a and 3b show schematic views of a semiconductor structure in a stage of a method according to an example of the present disclosure, wherein FIG. 3a shows a schematic top view and FIG. 3b shows a schematic cross-sectional view;

FIGS. 6a and 6b show schematic views of a semiconductor structure in a stage of a method according to an example of the present disclosure, wherein FIG. 6a shows a schematic top view and FIG. 6b shows a schematic cross-sectional view;

FIGS. 6c and 6d show a schematic cross-sectional view of a semiconductor structure in a stage of a method according to an example of the present disclosure after etching parts of the nanowires and coating the etched nanowires, respectively;

Figure 1:
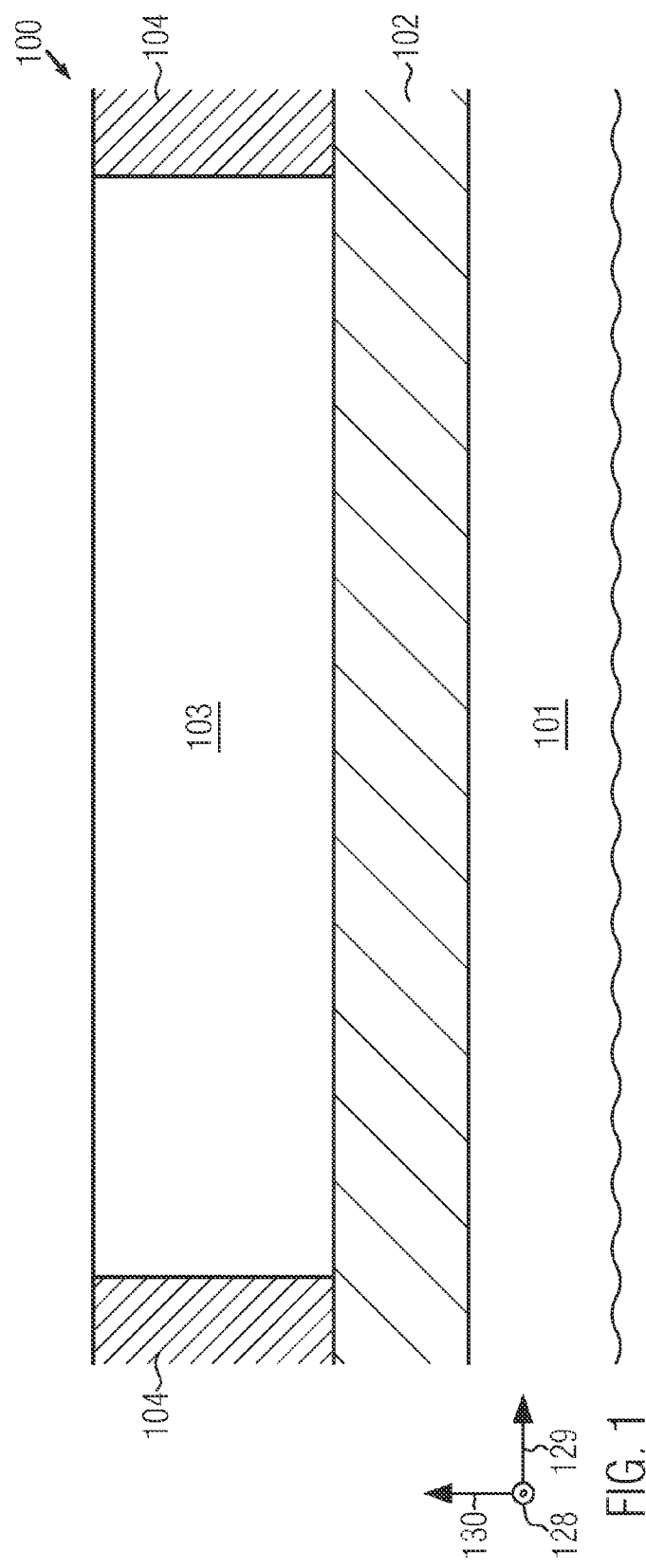
FIG. 1 shows a schematic cross-sectional view of a semiconductor structure in a stage of a method according to an example of the present disclosure.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The following embodiments are described in sufficient detail to enable those skilled in the art to make use of the invention. It is to be understood that other embodiments would be evident, based on the present disclosure, and that system, structure, process or mechanical changes may be made without departing from the scope of the present disclosure. In the following description, numeral-specific details are given to provide a thorough understanding of the disclosure. However, it would be apparent that the embodiments of the disclosure may be practiced without the specific details. In order to avoid obscuring the present disclosure, some well-known circuits, system configurations, structure configurations and process steps are not disclosed in detail.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

As will be readily apparent to those skilled in the art upon a complete reading of the present application, the present methods are applicable to a variety of technologies, e.g., NMOS, PMOS, CMOS, etc., and is readily applicable to a variety of devices, including, but not limited to, logic devices, memory devices, etc.

The present disclosure particularly provides a semiconductor device comprising a nanowire FET and a method for the manufacture of the same. The nanowire comprises a core and a shell of strained material. This core-shell structure results in improved performance of the FET as compared to nanowire transistors of the art. It is noted that the channel current of the inventive FET may be mainly carried in the shell of the nanowire. The shell-core structure may be used for both N-channel and P-channel FETs.

FIG. 1 shows a schematic cross-sectional view of a semiconductor structure 100 in a stage of a method according to an embodiment. The semiconductor structure 100 includes a substrate 101 that may be formed of a semiconductor material, for example, silicon. The substrate 101 has a thickness direction 130 (vertical in the plane of drawing of FIG. 1) or vertical direction, respectively. An extension of the substrate 101 in the vertical direction 130 may be smaller than extensions of the substrate 101 in a first horizontal direction 128 and a second horizontal direction 129 which are perpendicular to each other and to the vertical direction 130 of the substrate 101.

In the figures, directions that are perpendicular to the plane of drawing are shown as arrows, a direction pointing towards the viewer is shown as a circle with a dot, and a direction pointing away from the viewer is shown as a circle with an "x".

The substrate 101 may have a top surface and a bottom surface that are substantially perpendicular to the vertical direction 130 of the substrate 101. The substrate 101 may have the shape of a disc or a plate.

The semiconductor structure 100 further includes a semiconductor layer 103 and a dielectric layer 102. The dielectric layer 102 is provided between the semiconductor layer 103 and the substrate 101. The dielectric layer 102 separates the semiconductor layer 103 from the substrate 101, and provides electrical insulation between the semiconductor layer 103 and the substrate 101. The dielectric layer 102 may include a dielectric material such as silicon dioxide, silicon oxynitride and/or silicon nitride, and the semiconductor layer 103 may include a semiconductor material, such as silicon, silicon germanium, silicon carbide and/or a III-V semiconductor such as gallium arsenide. The semiconductor layer 103 may be substantially undoped. The substrate 101, the dielectric layer 102 and the semiconductor layer 103 form a semiconductor-on-insulator structure.

The semiconductor structure 100 further includes a trench isolation structure 104. The trench isolation structure 104 may be a shallow trench isolation structure. The trench isolation structure 104 may enclose the portion of the semiconductor layer 103 shown in FIG. 1 and may provide electrical insulation between the enclosed portion of the semiconductor layer 103 and other portions of the semiconductor layer 103 that are not shown in FIG. 1.

The formation of the semiconductor structure 100 may include applying techniques for forming a semiconductor-on-insulator structure that may include providing a first semiconductor wafer and a second semiconductor wafer. The first semiconductor wafer includes the semiconductor material of the substrate 101 and the second semiconductor wafer includes the semiconductor material of the semiconductor layer 103. One of the wafers, or both wafers, may have a layer of the dielectric material of the dielectric layer 102 formed thereon. The wafers may be bonded to each other, wherein the dielectric layer 102 is located between the wafers. Then, the second wafer including the semiconductor material of the semiconductor layer 103 may be cleaved. Thereafter, a polishing process, for example chemical mechanical polishing, may be performed to provide a substantially smooth surface of the semiconductor layer 103.

After the formation of the semiconductor-on-insulator structure, the trench isolation structure 104 may be formed by means of processes for forming a shallow trench isolation, including photolithography, etching, oxidation and/or deposition.

In the configuration shown in FIG. 1, the semiconductor layer 103 may have a thickness in a range from about 10 nm, corresponding to a thickness of a semiconductor layer in an ultra-thin body semiconductor-on-insulator wafer (UTB-SOI-wafer), to about 100 nm, corresponding to a thickness of a semiconductor layer in a normal semiconductor-on-insulator wafer.

Figure 2:
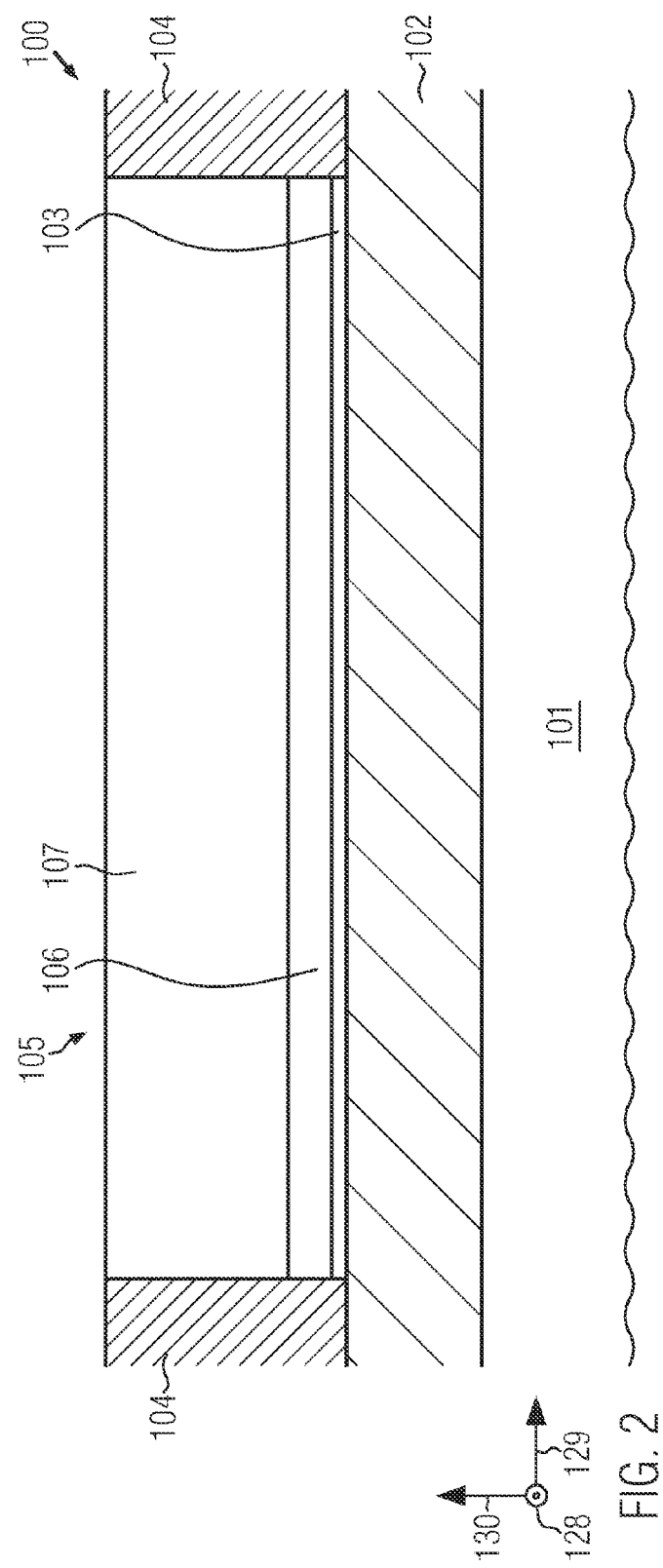
FIG. 2 shows a schematic cross-sectional view of a semiconductor structure in a stage of a method according to an example of the present disclosure.

FIG. 2 shows a schematic cross-sectional view of the semiconductor structure 100 in a later stage of the manufacturing process. A thickness of the semiconductor layer 103, being an extension of the semiconductor layer 103 in the vertical direction 130, may be reduced. After the reduction of the thickness of the semiconductor layer 103, the semiconductor layer 103 may have a thickness in a range from about 5-10 nm.

The reduction of the thickness of the semiconductor layer 103 may include an etch process adapted to selectively remove the semiconductor material of the semiconductor layer 103 relative to the material of the trench isolation structure 104. In the selective etching of a first material relative to a second material, both materials are exposed to an etchant adapted to remove the first material at a greater etch rate than the second material. The etch rate of a material specifies a thickness of a portion of a layer of the material that is removed per time unit when the material is exposed to the etchant, wherein the thickness is measured in a direction perpendicular to the surface of the material.

The etch process used for reducing the thickness of the semiconductor layer 103 may be a dry etch process, for example, a reactive ion etch (RIE) process adapted to selectively remove the material of the semiconductor layer 103 relative to the material of the trench isolation structure 104. For example, in embodiments wherein the semiconductor layer 103 includes silicon and the trench isolation structure 104 includes silicon dioxide, the etch process may be a reactive ion etch process wherein an etch gas including $CF_4$ is used. The thickness of the semiconductor layer 103 need not be reduced by means of an etch process. Alternatively or additionally, a chemical mechanical polishing process may be used. In chemical mechanical polishing, the semiconductor structure 100 is moved relative to a polishing pad, and a slurry is supplied to an interface between the semiconductor structure 100 and the polishing pad. Materials on the surface of the semiconductor structure 100, in particular the material of the semiconductor layer 103, are removed by chemical reactions between the material of the semiconductor layer 103 and chemical compounds in the slurry and/or by mechanical interactions between the material of the semiconductor layer 103 and the polishing pad. In the chemical mechanical polishing process, a part of the trench isolation structure 104 may also be removed, so that the thickness of the trench isolation structure is reduced.

After the reduction of the thickness of the semiconductor layer 103, an epitaxial growth process may be performed for epitaxially depositing a semiconductor layer 105 on the semiconductor layer 103. Due to the epitaxial deposition of the semiconductor layer 105, the semiconductor material of the semiconductor layer 105 can adapt to the crystalline structure of the semiconductor material of the semiconductor layer 103. Thus, a substantially single-crystalline structure of the semiconductor layer 105 may be obtained.

The epitaxial growth process may be adapted for selectively depositing semiconductor material on the semiconductor layer 103, wherein substantially no semiconductor material is deposited on exposed surface portions of the trench isolation structure 104 and/or only a small amount of semiconductor material is deposited on exposed surface portions of the trench isolation structure 104.

In some embodiments, portions of the semiconductor structure 100 on which no semiconductor material is to be deposited (not shown in FIG. 1) may be covered by a mask, for example, a hardmask including silicon nitride or silicon dioxide, while the semiconductor layer 105 is deposited. Due to the selectivity of the epitaxial growth process, substantially no semiconductor material or only a small amount of semiconductor material is deposited on the mask. Moreover, the portion of the semiconductor structure 100 shown in FIG. 2 may be covered by a mask while a selective epitaxial growth process for depositing semiconductor material in other portions of the semiconductor structure is performed.

Thus, different semiconductor materials and/or differently doped semiconductor material may be provided in different portions of the semiconductor structure 100. Differently doped semiconductor materials may be used for forming N-channel transistors and P-channel transistors in portions of the semiconductor structure 100.

The selective epitaxial growth process may be a chemical vapor deposition process or a plasma enhanced chemical vapor deposition process wherein parameters of the deposition process, such as composition and pressure of a reactant gas, temperature and/or a power of an electric discharge created in the reactant gas, are adapted such that a selective deposition of semiconductor material on the semiconductor layer 103 is obtained.

For example, in embodiments wherein the semiconductor layers 103, 105 include silicon, the selective epitaxial growth process used for forming the semiconductor layer 105 on the semiconductor layer 103 may be a chemical vapor deposition process or plasma enhanced chemical vapor deposition process wherein an etch gas including a chemical compound including silicon and chlorine, for example $SiCl_4$, $SiHCl_3$ and/or $SiH_2Cl_2$, is used. Alternatively, the etch gas may include a mixture of a chemical compound including silicon, for example $SiH_4$, and a substance including chloride, for example HCl and/or $Cl_2$.

The chlorine may react chemically with silicon atoms on the surface of the trench isolation structure 104 and/or the mask, wherein gaseous reaction products that are not bound to the surface are formed so that the silicon atoms are removed. Silicon atoms deposited on the surface of the semiconductor layer 103 and/or on silicon already deposited on the semiconductor layer 103 react with chlorine to a lower extent, so that growth of silicon is obtained on the surface of the semiconductor layer 103.

The selective epitaxial growth process need not be a chemical vapor deposition process or plasma enhanced chemical vapor deposition process. Alternatively, molecular beam epitaxy (MBE) or metal organic chemical vapor deposition (MOCVD) may be used.

The semiconductor layer 105 may include portions 106, 107, wherein a doping of the portion 106 is different from a doping of the portion 107. The portion 106 may be provided between the semiconductor layer 103 and the portion 107 of the semiconductor layer 105 and may be P-doped or N-doped. In some embodiments, the portion 106 of the semiconductor layer 105 may include an N-type dopant such as arsenic (As) or a P-type dopant such as boron (B). A concentration of the dopant may be in a range from about $10^{15}$ cm$^{-3}$ to about the solid solubility limit of each dopant (which may be approximately $10^{21}$ cm$^{-3}$), for example, about $10^{20}$ cm$^{-3}$. The portion 107 of the semiconductor layer 105 that is provided above the portion 106 may be substantially undoped or the portion 107 may be doped inversely to the doping of the portion 106 of the semiconductor layer 105. In embodiments wherein the portion 107 of the semiconductor layer 105 is doped inversely to the doping of the portion 106, the portion 107 may be P-doped if the portion 106 is N-doped, and the portion 107 may be N-doped if the portion 106 is P-doped. The thickness of the portion 106 may be in the range of 40-60 nm, in particular, 50-60 nm, and the thickness of the portion 107 may be in the range of 100-200 nm, for example, 120-160 nm.

As will be detailed in the following, a transistor may be formed in the semiconductor structure 100, wherein a drain region of the transistor is formed from the portion 106 of the semiconductor layer 105, and a channel region is formed from the portion 107. In embodiments wherein the transistor to be formed is an N-type transistor, the portion 106 of the semiconductor layer 105 may be N-doped, and in embodiments wherein the transistor to be formed is a P-channel transistor, the portion 106 of the semiconductor layer 105 may be P-doped.

A thickness of the portion 106 of the semiconductor layer 105, measured in the vertical direction 130 of the substrate 101 (vertical in the plane of drawing of FIG. 2), may be greater than the reduced thickness of the semiconductor layer 103 that is obtained after reducing the thickness of the first semiconductor layer 103.

In some embodiments, the thickness of the portion 106 of the semiconductor layer 105 may be greater than five times the reduced thickness of the semiconductor layer 103 and/or greater than ten times the reduced thickness of the semiconductor layer 103. For example, the reduced thickness of the semiconductor layer 103 may be in a range from about 5-10 nm, and the portion 106 of the semiconductor layer 105 may have a thickness in a range from about 50-60 nm.

Thus, a drain region of the transistor formed in the semiconductor structure 100 that is located close to the dielectric layer 102 may be obtained. A relatively low thickness of the portion of the semiconductor layer 103 remaining in the semiconductor structure 100 after the reduction of the thickness of the semiconductor layer 103 may be sufficient to provide a substantially single crystalline structure of the semiconductor layer 105, while having only a small or substantially no influence on the electric characteristics of the transistor.

The thickness of the portion 107 of the semiconductor layer 105 may be greater than the thickness of the portion 106 of the semiconductor layer 105 and/or greater than twice the thickness of the portion 106. In some embodiments, the portion 107 of the semiconductor layer 105 may have a thickness in a range from about 130-150 nm, for example, a thickness of about 140 nm.

The thickness of the portion 107 of the semiconductor layer may be greater than a sum of a gate length and a thickness of a source spacer of a transistor to be formed in the semiconductor structure 100. In one embodiment, the gate length may be approximately 26 nm (22 nm-Node), the thickness of the source spacer may be approximately 20 nm and the thickness of the portion 107 of the semiconductor layer 105 may be approximately 140 nm to provide additional tolerance. The gate length and the source spacer will be explained below.

The doping of the portions 106, 107 of the semiconductor layer 105 may be provided by in situ doping the material of the semiconductor layer 105 during the deposition process. For this purpose, a dopant or a chemical compound comprising the dopant may be supplied during the deposition of the material of the semiconductor layer, so that the dopant is included into the semiconductor layer 105. For forming a substantially undoped portion 107 of the semiconductor layer 105, a supply of dopant or chemical compound comprising a dopant may be omitted during the formation of the portion 107.

Figure 3A:
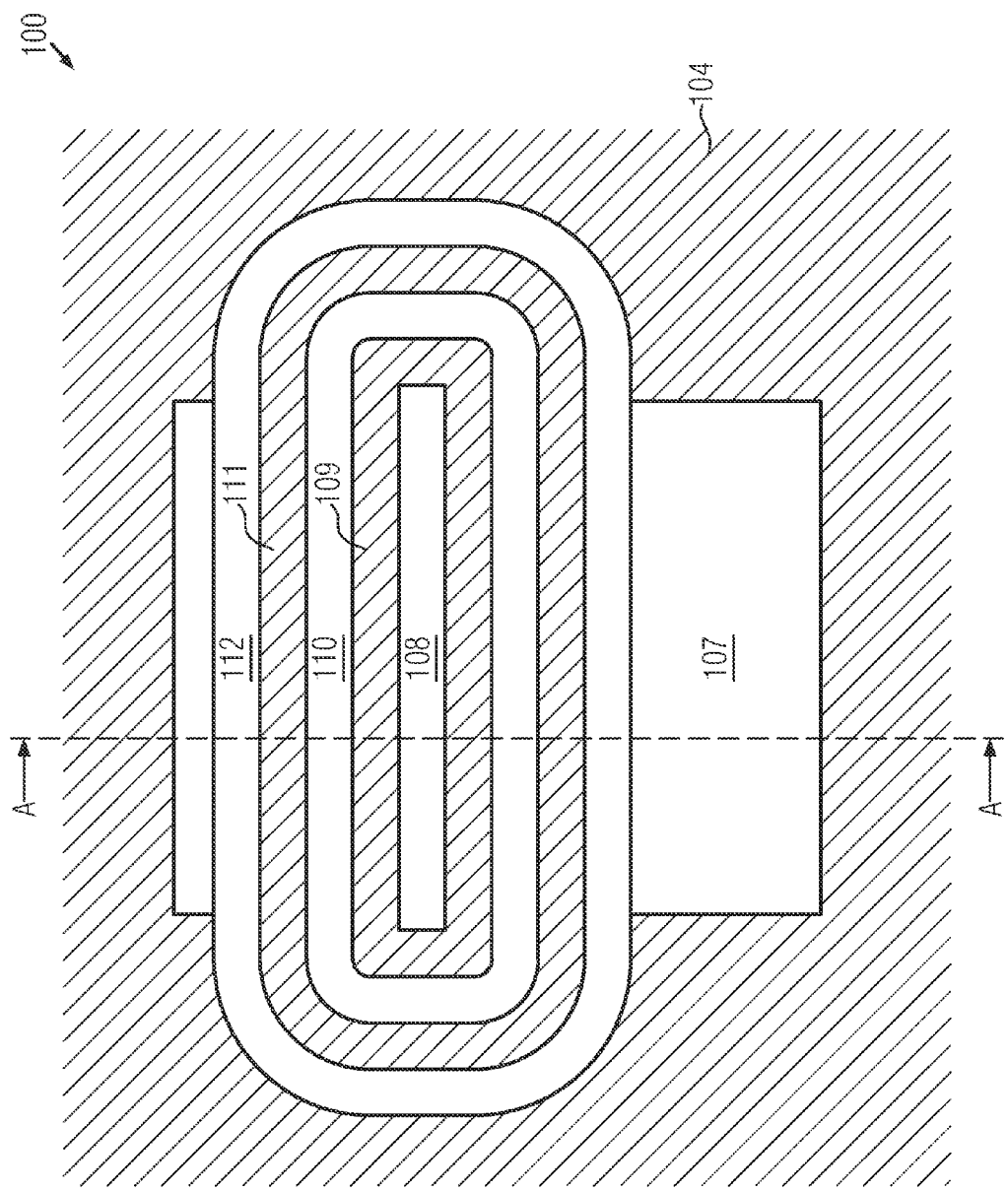
Figure 3B:
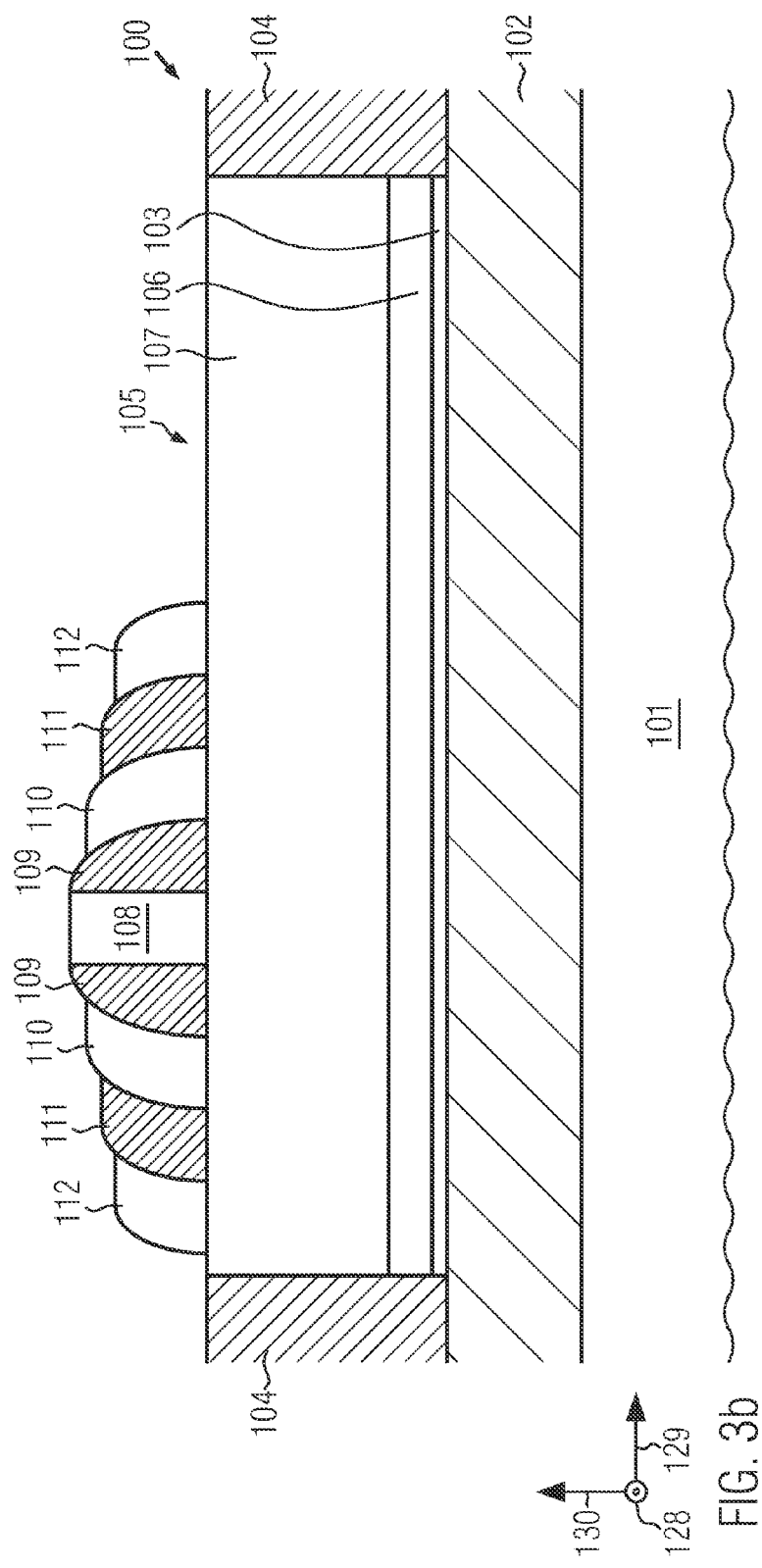

FIGS. 3a and 3b show schematic views of the semiconductor structure 100 in a later stage of the manufacturing process. FIG. 3a shows a schematic top view, and FIG. 3b shows a schematic cross-sectional view along the line A-A in FIG. 3a, corresponding to the cross-sectional views shown in FIGS. 1 and 2.

A first patterning of the portion of the semiconductor layer 105 enclosed by the trench isolation structure 104 is performed. In the first patterning process, a dummy structure 108 is formed on the semiconductor layer 105. The dummy structure 108 may include silicon nitride. Alternatively, the dummy structure 108 may include silicon dioxide or silicon oxynitride. The dummy structure 108 may have an elongated shape, wherein an extension of the dummy structure 108 in the first horizontal direction 128 (horizontal in the view of FIG. 3a) is greater than an extension of the dummy structure 108 in the second horizontal direction 129 (vertical in the view of FIG. 3a).

In the first horizontal direction 128, the dummy structure 108 may extend across the portion of the semiconductor layer 105 enclosed by the trench isolation structure 104, and/or the ends of the dummy structure 108 may overlap with the trench isolation structure 104. The extension of the dummy structure 108 in the second horizontal direction 129 may be smaller than the extension of the portion of the semiconductor layer 105 enclosed by the trench isolation structure 104 in the second horizontal direction 129, so that a part of the portion of the semiconductor layer 105 enclosed by the trench isolation structure 104 is not covered by the dummy structure 108.

The dummy structure 108 need not be located at the center of the portion of the semiconductor layer 105 enclosed by the trench isolation structure 104. As shown in FIGS. 3a and 3b, a greater part of the portion of the semiconductor layer 105 enclosed by the trench isolation structure 104 may be located on a first side of the dummy structure 108 (below the dummy structure 108 in the view of FIG. 3a and to the right of the dummy structure 108 in the view of FIG. 3b) than on a second side of the dummy structure 108 (above the dummy structure 108 in the view of FIG. 3a and on the left of the dummy structure 108 in the view of FIG. 3b).

As will be detailed below, a drain contact via of the transistor to be formed in the semiconductor structure 100 may be provided in the part of the semiconductor structure 100 on the first side of the dummy structure 108. By not providing the dummy structure 108 at the center of the portion of the semiconductor layer 105 enclosed by the trench isolation structure 104, more space for forming the drain contact via may be provided compared to an arrangement in the center.

For forming the dummy structure 108, a layer of a material of the dummy structure 108, for example, a layer of silicon nitride, silicon dioxide or silicon oxynitride, may be deposited by means of a deposition process, for example, by means of chemical vapor deposition or plasma enhanced chemical vapor deposition. Thereafter, the layer of the material of the dummy structure 108 may be patterned.

The patterning of the layer of the material of the dummy structure 108 may include a photolithography process. In some embodiments, a width of the dummy structure 108 in the second horizontal direction 129 may substantially correspond to a resolution of the photolithography process employed in the formation of the dummy structure 108. For example, the width of the dummy structure 108 in the second horizontal direction 129 may be less than twice the resolution of the photolithography process. The width of the dummy structure 108 in the second horizontal direction 129 may be in a range from about 30-40 nm.

In other embodiments, the width of the dummy structure 108 in the second horizontal direction 129 may be smaller than the resolution of the photolithography process used for forming the dummy structure 108. In such embodiments, the dummy structure 108 may first be formed with a greater width in the second horizontal direction 129, for example a width that substantially corresponds to the resolution of the photolithography process, and an etch process may then be performed for reducing the width of the dummy structure 108 in the second horizontal direction 129. Alternatively, multiple patterning processes may be employed for forming the dummy structure 108.

After the formation of the dummy structure 108, spacers 109, 110, 111, 112 may be formed adjacent the dummy structure 108. The spacers 110, 112 may be formed of substantially the same material as the dummy structure 108. The spacers 109, 111 may be formed of a material that may be selectively etched relative to the material of the dummy structure 108 and the spacers 110, 112.

In embodiments wherein the dummy structure 108 and the spacers 110, 112 are formed of silicon nitride, the spacers 109, 111 may include silicon dioxide or silicon oxynitride. In embodiments wherein the dummy structure 108 and the spacers 110, 112 are formed of silicon dioxide, the spacers 109, 111 may include silicon nitride or silicon oxynitride, and in embodiments wherein the dummy structure 108 and the spacers 110, 112 are formed of silicon oxynitride, the spacers 109, 111 may include silicon nitride or silicon dioxide.

Each of the spacers 109, 110, 111, 112 may be formed by substantially isotropically depositing a layer of the material of the respective spacer over the semiconductor structure 100 and then performing an anisotropic etch process.

In the anisotropic etch process, portions of the layer of the material of the spacer on substantially horizontal portions of the semiconductor structure 100, for example on the surface of the semiconductor layer 105, the top surface of the dummy structure 108 and the top surface of the trench isolation structure 104, are removed at a greater etch rate than portions of the layer on inclined portions of the semiconductor structure 100, such as the sidewalls of the dummy structure 108 and/or sidewalls of spacers that have already been formed.

The anisotropic etch process may be adapted to selectively remove the material of the spacer being formed relative to other materials on the semiconductor structure 100, in particular relative to the semiconductor material of the semiconductor layer 105 and/or the material of the feature adjacent the spacer to be formed, which may be the dummy structure 108 or another one of the spacers 109 to 112.

The anisotropic etch process may be stopped as soon as portions of the layer of the material of the spacer on substantially horizontal portions of the semiconductor structure 100 are removed. Due to the anisotropy of the etch process, portions of the material layer on inclined portions of the semiconductor structure 100 are not removed and form one of the spacers 109, 110, 111, 112.

Figure 4:
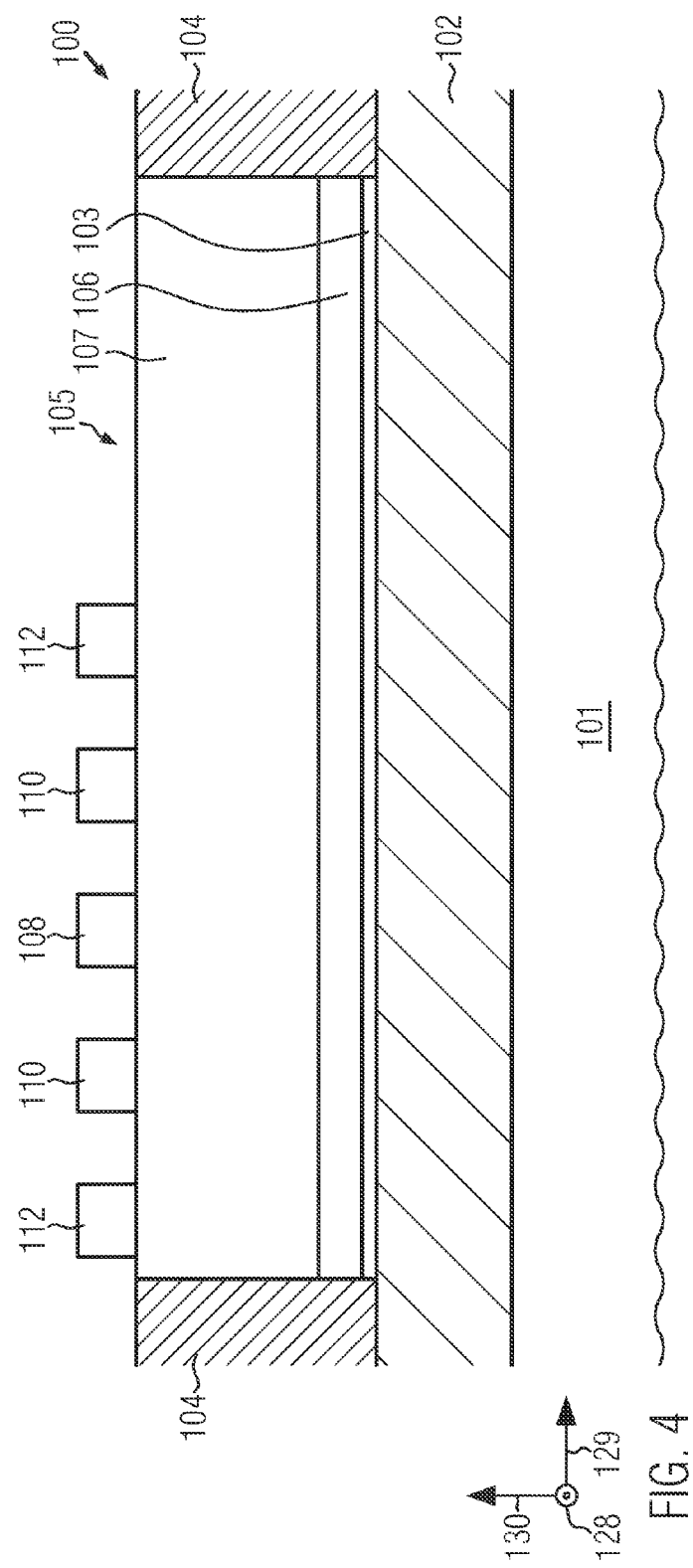
FIG. 4 shows a schematic cross-sectional view of a semiconductor structure in a stage of a method according to an example of the present disclosure.

FIG. 4 shows a schematic cross-sectional view of the semiconductor structure 100 in a later stage of the manufacturing process. After the formation of the dummy structure 108 and the spacers 109, 110, 111, 112, a planarization of the semiconductor structure 100 may be performed. The planarization may include a chemical mechanical polishing process.

In some embodiments, after the formation of the dummy structure 108 and the spacers 109 to 112 and before the planarization, a sacrificial layer (not shown) of substantially the same material as the spacers 109, 111 may be formed over the semiconductor structure 100. The sacrificial layer may help to protect the semiconductor layer 105 and the trench isolation structure 104 during the planarization process and may be removed later in the manufacturing process, as will be detailed below. In other embodiments, the sacrificial layer may be omitted.

In the planarization, portions of the dummy structure 108 and the spacers 109 to 112 may be removed, so that the dummy structure 108 and the spacers 109 to 112 obtain a substantially equal thickness in the vertical direction 130 and each of the dummy structure 108 and the spacers 109 to 112 is exposed at the surface of the semiconductor structure 100. In embodiments wherein a sacrificial layer as described above is used, in the planarization, a portion of the sacrificial layer on top of the dummy structure 108 and the spacers 109 to 112 may be removed, whereas a portion of the sacrificial layer directly on the semiconductor layer 105 may remain on the semiconductor structure 100.

After the planarization process, the spacers 109, 111 and the optional sacrificial layer may be removed for exposing the semiconductor layer 105 with the exception of those portions that are covered by the dummy structure 108 and the spacers 110, 112. These features form masks extending across the portion of the semiconductor layer 105 enclosed by the trench isolation structure 104 along the first horizontal direction 128, as can be seen by comparing FIG. 4 with FIGS. 3a and 3b. Widths of the masks correspond to the widths of the dummy structure 108 and the spacers 110, 112. At the locations of the spacers 109, 111, gaps between the masks are provided, wherein a width of the gaps corresponds to the widths of the spacers 109, 111.

Figure 5:
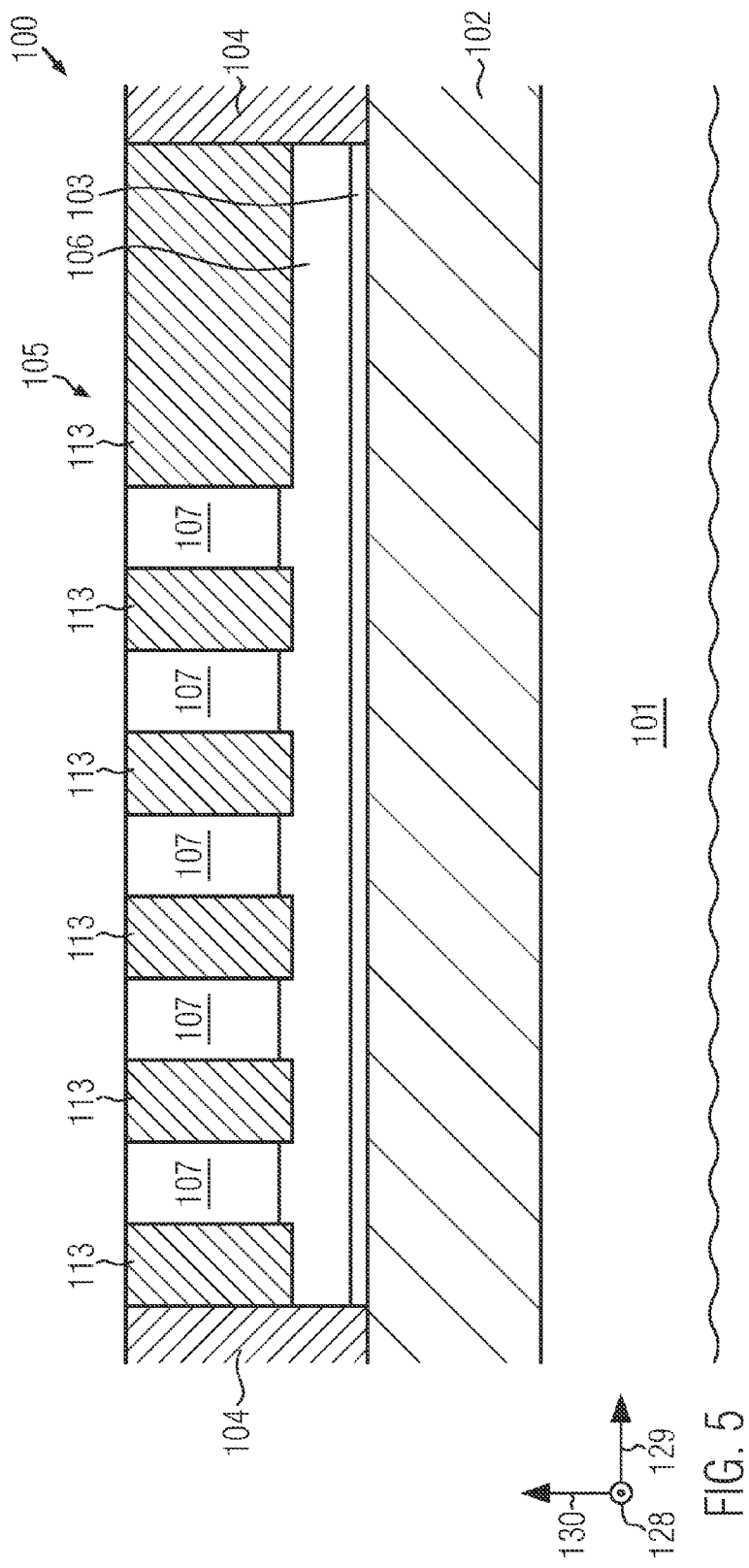
FIG. 5 shows a schematic cross-sectional view of a semiconductor structure in a stage of a method according to an example of the present disclosure.

FIG. 5 shows a schematic cross-sectional view of the semiconductor structure 100 in a later stage of the manufacturing process. An etch process may be performed for partially removing portions of the semiconductor layer 105 that are not covered by the masks provided by the dummy structure 108 and the spacers 110, 112. The etch process may be adapted to selectively remove the material of the semiconductor layer 105 relative to the materials of the dummy structure 108, the spacers 110, 112 and the trench isolation structure 104. In embodiments wherein the semiconductor layer 105 includes silicon and the dummy structure 108, the spacers 110, 112 and the trench isolation structure 104 include silicon dioxide, silicon oxynitride and/or silicon nitride, the etch process may be adapted to selectively etch silicon relative to silicon dioxide, silicon oxynitride and/or silicon nitride.

The etch process may be an anisotropic etch process wherein portions of the semiconductor layer 105 that are below the dummy structure 108 and the spacers 110, 112 are substantially not etched, so that the portions of the semiconductor layer 105 below the dummy structure 108 and the spacers 110, 112 remaining in the semiconductor structure 100 after the etch process form elongated semiconductor protrusions having substantially vertical sidewalls that extend along the vertical direction 130.

The portions of the semiconductor layer 105 that are not covered by the dummy structure 108 and the spacers 110, 112 are not completely removed in the etch process. Instead, the etch process may be adapted to substantially completely remove parts of the portion 107 of the semiconductor layer 105 that are not covered by the dummy structure 108 and the spacers 110, 112, whereas at least parts of the portion 106 of the semiconductor layer 105 may remain in substantially the entire area of the semiconductor structure 100 enclosed by the trench isolation structure 104. Moreover, the semiconductor layer 103 may remain in the semiconductor structure 100.

After the etch process, elongated semiconductor protrusions including parts of the portion 107 of the semiconductor layer 105 extend across the semiconductor structure 100 along the first horizontal direction 128. In the etch process, the semiconductor material of the semiconductor layer 105 may be etched to a greater depth than the thickness of the portion 107 of the semiconductor layer 105, so that the elongated semiconductor protrusions include parts of the portion 106 of the semiconductor layer 105, and there is a transition between the differently doped portions 106, 107 of the semiconductor layer 105 within each of the elongated semiconductor protrusions.

The width of the elongated semiconductor protrusions in the second horizontal direction 129 substantially corresponds to the width of the dummy structure 108 and the spacers 110, 112. Between the elongated semiconductor protrusions, there are grooves having a width substantially corresponding to a width of the spacers 109, 111. Thus, the width of the elongated semiconductor protrusions and the spacing between the elongated semiconductor protrusions may be controlled by selecting corresponding widths of the dummy structure 108 and the spacers 109 to 112.

In some embodiments, the width of the spacers 110, 112 may be substantially equal to a width of the dummy structure 108, so that all the elongated semiconductor protrusions have substantially the same width. In other embodiments, the width of the spacers 110, 112 may be smaller than the width of the dummy structure 108, so that the elongated semiconductor protrusion formed below the dummy structure 108 is wider than the elongated semiconductor protrusions formed below the spacers 110, 112.

The width of the spacers 109 to 112 depends on the thickness of the material layers that are isotropically deposited in the formation of the spacers 109 to 112 and the degree of anisotropy of the etch process performed in the formation of the spacers 109 to 112. Thus, the width of the spacers 109 to 112 is not limited by properties of a photolithography process, so that the widths of the elongated semiconductor protrusions formed below the spacers 110, 112 and the distance between the elongated semiconductor protrusions may be smaller than a resolution of the photolithography process employed in the formation of the dummy structure 108. In some embodiments, the spacers 109 to 112 may have a width in a range from about 5-20 nm.

After the etch process, the dummy structure 108 and the spacers 110, 112 that were used as a mask in the first patterning process may be removed. This may be done by means of an etch process adapted to selectively remove the material of the dummy structure 108 and the spacers 110, 112 relative to the materials of the semiconductor layer 105 and the trench isolation structure 104. In embodiments wherein the dummy structure 108 and the spacers 110, 112 include silicon nitride, the trench isolation structure 104 includes silicon dioxide and the semiconductor layer 105 includes silicon, the etch process may be adapted to selectively remove silicon nitride relative to silicon and silicon dioxide.

After the removal of the dummy structure 108 and the spacers 110, 112, the grooves between the elongated semiconductor protrusions formed from the semiconductor layer 105 and the space between the elongated semiconductor protrusions and the trench isolation structure 104 may be filled with a fill material 113. In some embodiments, this may be done by depositing a layer of the fill material 113 over the semiconductor structure 100. Thereafter, a planarization process, for example a chemical mechanical polishing process, may be performed for providing a substantially planar surface of the semiconductor structure and for exposing the elongated semiconductor protrusions and/or for exposing the trench isolation structures 104.

The present disclosure is not limited to embodiments wherein the dummy structure 108 and the spacers 110, 112 are removed by means of an etch process as described above. Alternatively, the dummy structure 108 and the spacers 110, 112 may remain on the semiconductor structure 100 during the deposition of the fill material 113 and may be removed during the subsequent chemical mechanical polishing process.

Figure 6D:
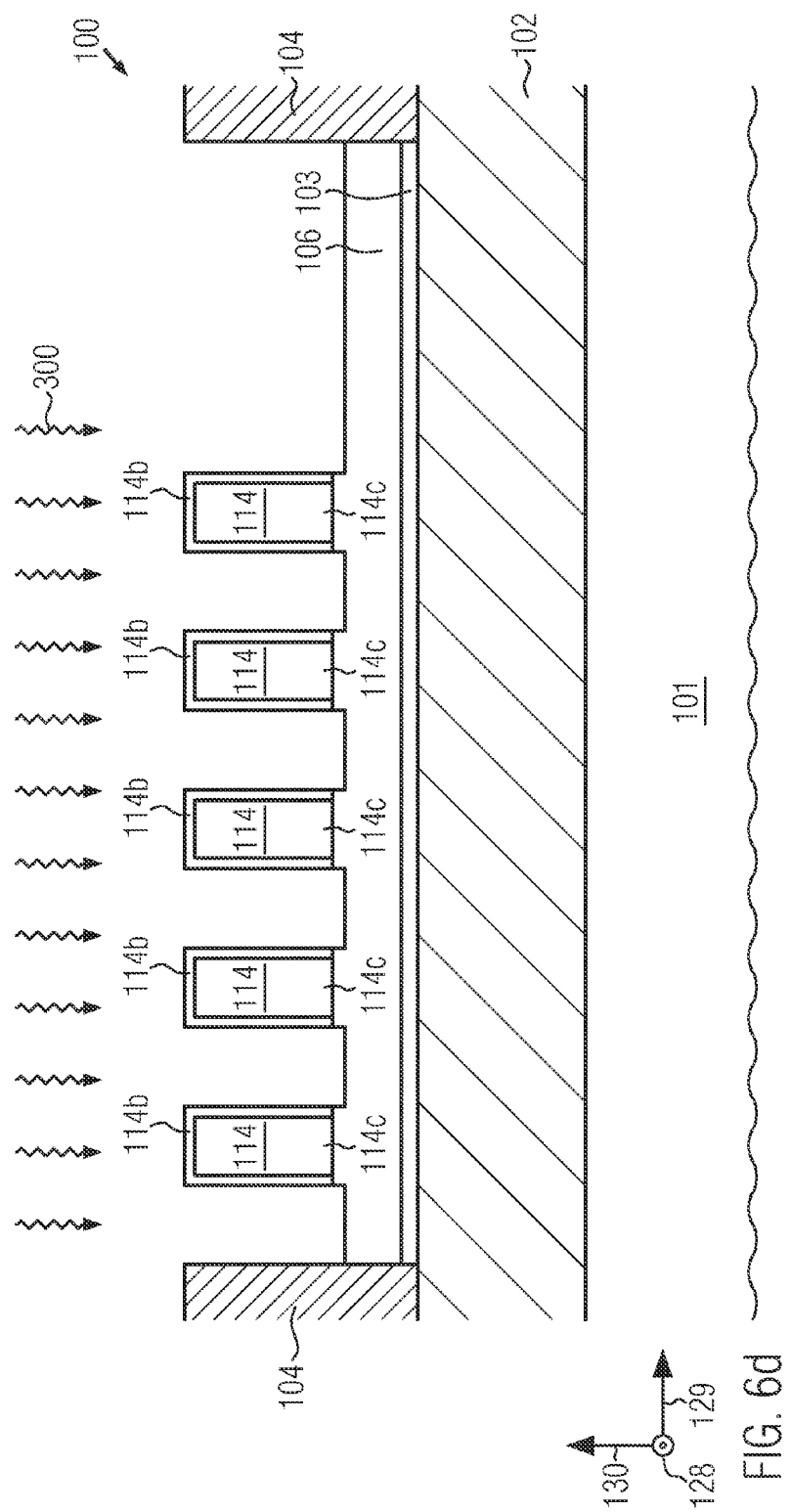

FIGS. 6a and 6b show schematic views of the semiconductor structure 100 in a later stage of the manufacturing process. FIG. 6a shows a schematic top view, and FIG. 6b shows a schematic cross-sectional view along the line A-A shown in FIG. 6a, corresponding to the cross-sections shown in FIGS. 1, 2, 3b, 4 and 5.

A second patterning process of the portion of the semiconductor layer 105 enclosed by the trench isolation structure 104 is performed for forming a plurality of nanowires 114 extending in the vertical direction 130 of the substrate 101. A length of the nanowires 114 in the vertical direction 130 may be greater than widths of the nanowires 114 in the first horizontal direction 128 and the second horizontal direction 129 of the substrate 101. In some embodiments, the length of the nanowires 114 in the vertical direction 130 may be more than twice, more than three times, more than five times and/or more than ten times the widths of the nanowires 114 in the first horizontal direction 128 and/or the second horizontal direction 129.

The portion 106 of the semiconductor layer 105 may be exposed between the nanowires 114, wherein substantially no residues of the portion 107 of the semiconductor layer 105 remain in the gaps between the nanowires 114 and in the space between the nanowires 114 and the trench isolation structure 104. The nanowires 114 may include an upper portion formed of material from the portion 107 of the semiconductor layer 105. The length of the nanowires 114 in the vertical direction 130 of the substrate 100 may be greater than the thickness of the portion 107 of the semiconductor layer 105, so that each of the nanowires 114 includes a lower portion formed from material of the portion 106 of the semiconductor layer 105.

Thus, in each of the nanowires 114, a transition between a first doping corresponding to the doping of the portion 106 of the semiconductor layer 105 and a second doping corresponding to the doping of the portion 107 of the semiconductor layer 105 may be provided. In particular, each of the nanowires 114 may include a transition between a P-doped or an N-doped region, respectively, and a substantially undoped region, wherein the substantially undoped region is provided at a greater distance to the substrate 101 than the P-doped or N-doped region. Alternatively, each of the nanowires 114 may include a PN transition, if the nanowires are formed from a semiconductor layer 105 wherein the portion 107 is doped inversely to the doping of the portion 106.

In the second patterning process, a dummy structure similar to the dummy structure 108 may be formed over the semiconductor structure 100. Similar to the dummy structure 108, this second dummy structure may have an elongated shape, wherein a width of the second dummy structure is substantially equal to or slightly greater than a resolution of a photolithography process employed for the formation of the second dummy structure. In embodiments wherein the width of the second dummy structure is reduced after the formation of the second dummy structure and/or wherein multiple patterning processes are employed for the formation of the second dummy structure, the width of the second dummy structure may be smaller than the resolution of the photolithography process.

However, the arrangement of the second dummy structure relative to the substrate 101 is different from the arrangement of the dummy structure 108. Whereas, as described above, the length direction of the dummy structure 108 extends along the first horizontal direction 128, the length direction of the second dummy structure may extend along the second horizontal direction 129. Thus, the second dummy structure extends across the portion of the semiconductor structure 100 enclosed by the trench isolation structure 104 in the second horizontal direction 129, and the width of the second dummy structure extends along the first horizontal direction 128. Hence, compared to the dummy structure 108, the arrangement of the second dummy structure is rotated by an angle of approximately 90 degrees.

Further features of the second patterning process may correspond to the first patterning process described above with reference to FIGS. 3a-5. In particular, spacer elements and/or a sacrificial material layer may be formed adjacent the second dummy structure, a planarization may be performed, some of the spacers and/or the optional sacrificial layer may be selectively etched relative to the material of the second dummy structure and one or more other spacers, and an etch process for selectively etching the material of the semiconductor layer 105 relative to the materials of the second dummy structure, the spacers remaining on the semiconductor structure 100 and/or the trench isolation structure 104 may be performed. A depth of the etch process may be approximately equal to the depth of the etch process employed in the first patterning process.

Thus, the nanowires 114 are formed at locations at which the semiconductor layer 105 is covered during both patterning processes by a respective dummy structure and/or a respective one of the spacers that remain on the semiconductor structure 100 when the material of the semiconductor layer 105 is etched. The nanowires may have widths of below 20 nm, in particular, 5-15 nm.

The second dummy structure need not be arranged at the center of the portion of the semiconductor structure 100 enclosed by the trench isolation structure 104. Thus, a space for providing a gate contact via providing an electric contact to the gate electrode of the transistor to be formed in the semiconductor structure 100 may be provided on one side of the nanowires 114. For example, the space for providing the gate contact via may be located on the right side in the top view shown in FIG. 6a.

The present disclosure is not limited to embodiments wherein the first 108 and the second dummy structure remain on the semiconductor structure 100 in the first and the second patterning process when the material of the semiconductor layer 105 is etched. Alternatively, in one of the patterning processes, or in both patterning processes, the dummy structure may be removed, and spacers adjacent the dummy structure formed of a different material than the dummy structure, for example the spacers 109, 111, may remain on the semiconductor structure 100 and may be used as a mask when the material of the semiconductor layer 105 is etched.

For example, in the first patterning process, the dummy structure 108 may be removed and the spacers 109, 111 may be used as an etch mask, and the second patterning process may be performed as described above. Thus, different from the configuration shown in FIG. 6a, only four rows of nanowires 114, the rows of nanowires being arranged along the first horizontal direction 128, may be formed. In further embodiments, a greater or smaller number of spacers similar to spacers 109 to 112 may be formed for providing a different number of nanowires.

According to the present disclosure, performance of a semiconductor device formed based on nanowires is improved by providing nanowires with strained outer layers (shells). Particularly, the nanowires may provide channel regions for transistor devices. Experiments have shown that the maximum carrier density can be in the shells. In this case, tensile stress in the nanowire shell may enhance electron mobility in an N-channel FET, whereas compressive stress in the nanowire shell may enhance hole mobility in a P-channel FET. As shown in FIG. 6c, an etching process 200 may be performed to remove parts at outer edges of the (provisional) nanowires 114. The etching process 200 may be an isotropic etching removing at least nanowire material 114a of a thickness of 2 nm, particularly, at least 3 nm or 4 nm at the outer edges of the (provisional) nanowires. The remaining nanowire material forms the core of the eventually resulting nanowires (see FIG. 6b). During an epitaxial deposition process 300, material of the thickness of the previously removed nanowire material (or a different thickness) is deposited to form shells 114b of the nanowires 114. The strained material may be properly doped. For example, a material comprising or consisting of SiGe may be deposited in the deposition process 300. The SiGe material may comprise at least 20%, in particular, at least 30%, Ge resulting in a (biaxial) compressive stress in the shells 114b and a (biaxial) tensile stress in the cores 114c of the nanowires 114.

For a channel length of about 26 nm and a diameter of the nanowire (including core and shell) of about 17 nm, for example, wherein the shell has a thickness of about 2.5 nm and assuming cylindrical geometry of the nanowire, the volumes of the Si core and SiGe shell of the nanowire 114 each may contribute to about 50% of the channel region. In this case, a maximum strain will be exhibited for enhancing the mobility of the charge carriers.

Figure 7:
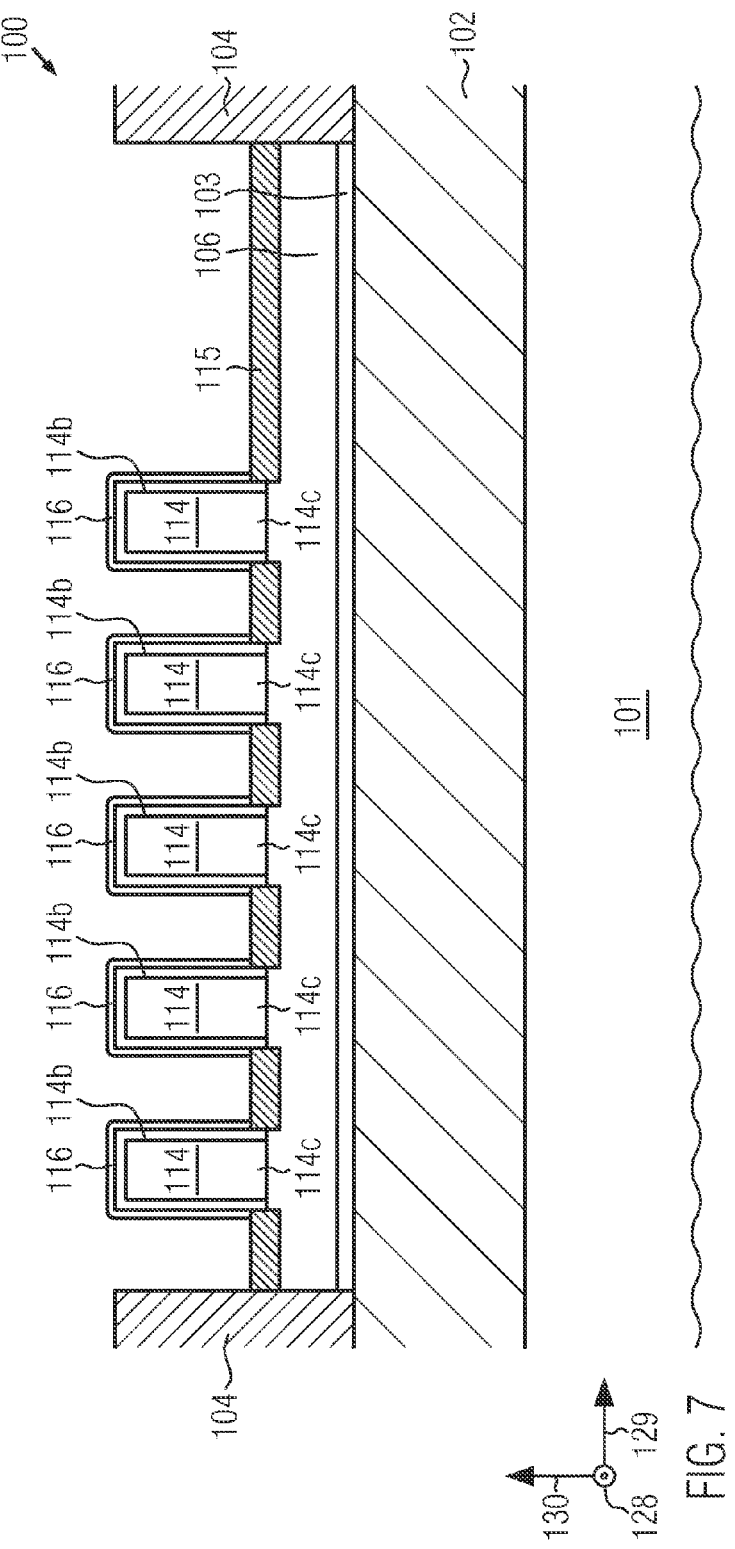
FIG. 7 shows a schematic cross-sectional view of a semiconductor structure in a stage of a method according to an example of the present disclosure.

FIG. 7 shows a schematic cross-sectional view of the semiconductor structure 100 in a later stage of the manufacturing process. After the formation of the nanowires 114 comprising the shells 114b and cores 114c, a drain spacer 115 may be formed. The drain spacer 115 may be formed of a dielectric material having a relatively low dielectric constant, for example, silicon dioxide. Alternatively, the drain spacer 115 may be formed of silicon nitride or silicon oxynitride. The formation of the drain spacer 115 may include an anisotropic deposition process. In the anisotropic deposition process, a layer of a drain spacer material is deposited over the semiconductor structure 100, wherein a deposition rate of the drain spacer material over substantially horizontal portions of the semiconductor structure 100 is greater than a deposition rate of the drain spacer material over inclined portions of the semiconductor structure 100.

The substantially horizontal portions of the semiconductor structure 100 include the surface of the portion 106 of the semiconductor layer 105 exposed between the nanowires 114 and in the space between the nanowires 114 and the trench isolation structure 104, as well as top surfaces of the nanowires 114 and the trench isolation structure 104. The inclined portions of the semiconductor structure 100 include sidewalls of the trench isolation structure 104 and the nanowires 114.

The layer of drain spacer material formed in the anisotropic deposition process has a greater thickness on the horizontal portions of the semiconductor structure 100 than on the inclined portions, the thickness being measured in a direction substantially perpendicular to the surface of the respective portion of the semiconductor structure 100. In particular, a portion of the layer of drain spacer material on the surface of the exposed portion 106 of the semiconductor layer 105 between the nanowires 114 has a greater thickness than a portion of the layer of drain spacer material on the sidewalls of the nanowires 114.

The anisotropic deposition process used for forming the layer of drain spacer material may be a high density plasma chemical vapor deposition process. In embodiments wherein the drain spacer 115 includes silicon dioxide, in the high density plasma chemical vapor deposition process, a reactant gas including silane ($SiH_4$), oxygen ($O_2$) and a noble gas, for example argon (Ar) or helium (He), may be used. Oxygen molecules and noble gas atoms in the reactant gas may be excited by the high density plasma source so that ions are formed.

A bias voltage applied to the semiconductor structure 100 and/or an electrode in the vicinity of the semiconductor structure 100 pulls the ions towards the surface of the semiconductor structure 100. Oxygen ions react with silane to form silicon dioxide that is deposited on the semiconductor structure 100, while the noble gas ions simultaneously sputter deposited material away. The rate at which material is sputtered may be particularly high in the vicinity of edges of the nanowires 114 and/or the trench isolation structure 104.

Parameters of the high density plasma chemical vapor deposition process, such as plasma density, bias voltage, composition of the reactant gas, pressure and temperature, may be adapted such that a net deposition of silicon dioxide on the semiconductor structure 100 occurs, whereas the simultaneous sputtering of the deposited material prevents a formation of overhangs at the edges of the nanowires 114 and/or the trench isolation structure 104. Thus, deposition of material in the gaps between the nanowires 114 and the space between the nanowires 114 and the trench isolation structure 104 may be obtained substantially without a formation of voids.

After the anisotropic deposition of the layer of drain spacer material, an isotropic etch process, which may, for example, be a dry etch process, may be performed. In the isotropic etch process, an etch rate of portions of the layer of drain spacer material on the inclined surface portions of the semiconductor structure 100 may be substantially equal to an etch rate of portions of the layer of drain spacer material on the substantially horizontal portions of the surface of the semiconductor structure 100.

In the isotropic etch process, portions of the layer of drain spacer material on top surfaces of the nanowires 114 and/or the top surface of the trench isolation structure 104 may be affected by an etchant used in the isotropic etch process to a greater extent than portions of the layer of drain spacer material on the surface of the portion 106 of the semiconductor layer 105 exposed between the nanowires 114. The etchant may interact with the top surface and the side surfaces of the portions of the layer of drain spacer material on top of the nanowires 114 and the trench isolation structure 104. To the contrary, there are no such side surfaces at the portions of the layer of drain spacer material on the portion 106 of the semiconductor layer 105 between the nanowires 114. Due to the relatively small extension of the nanowires 114 and the trench isolation structure 104 in the horizontal directions 128, 129, the areas of the side surfaces of the portions of the layer of drain spacer material on top of the nanowires 114 and the trench isolation structure 104 may be of about the same order of magnitude than the area of the top surfaces. Therefore, a faster removal of drain spacer material may be obtained at the top surfaces of the nanowires 114 and the trench isolation structure 104 than at the portions between the nanowires 114 and in the space between the nanowires 114 and the trench isolation structure 104.

The isotropic etch process may be performed until rests of the layer of drain spacer material are present substantially only on the surface of the portion 106 of the semiconductor layer 105 between the nanowires 114 and in the space between the nanowires 114 and the trench isolation structure 104. The rests of the layer of drain spacer material form the drain spacer 115, as shown in FIG. 7. The drain spacer 115 may cover the surface of the portion 106 of the semiconductor layer 105, wherein the nanowires 114 extend through openings in the drain spacer 115, and side surfaces and top surfaces of the nanowires 114 are exposed. Thus, the drain spacer 115 annularly encloses each of the nanowires 114.

After the formation of the drain spacer 115, a gate insulation layer 116 may be formed on the exposed surfaces of the nanowires 114. In embodiments wherein the nanowires 114 include silicon, the gate insulation layer 116 may include silicon dioxide and may be formed by a thermal oxidation process. In some embodiments, the gate insulation layer 116 may be a silicon dioxide layer having a thickness of about 2 nm and may be formed by a thermal oxidation process performed for about 20 seconds at a temperature of about 850° C. in an oxidizing ambient, such as a gas comprising oxygen and/or water. In other embodiments, the gate insulation layer 116 may include a high-k material such as, for example, hafnium dioxide and may be formed by means of techniques for forming a high-k gate insulation layer on a semiconductor surface similar to techniques employed in the formation of planar field effect transistors comprising a gate insulation layer formed of a high-k material.

Figure 8:
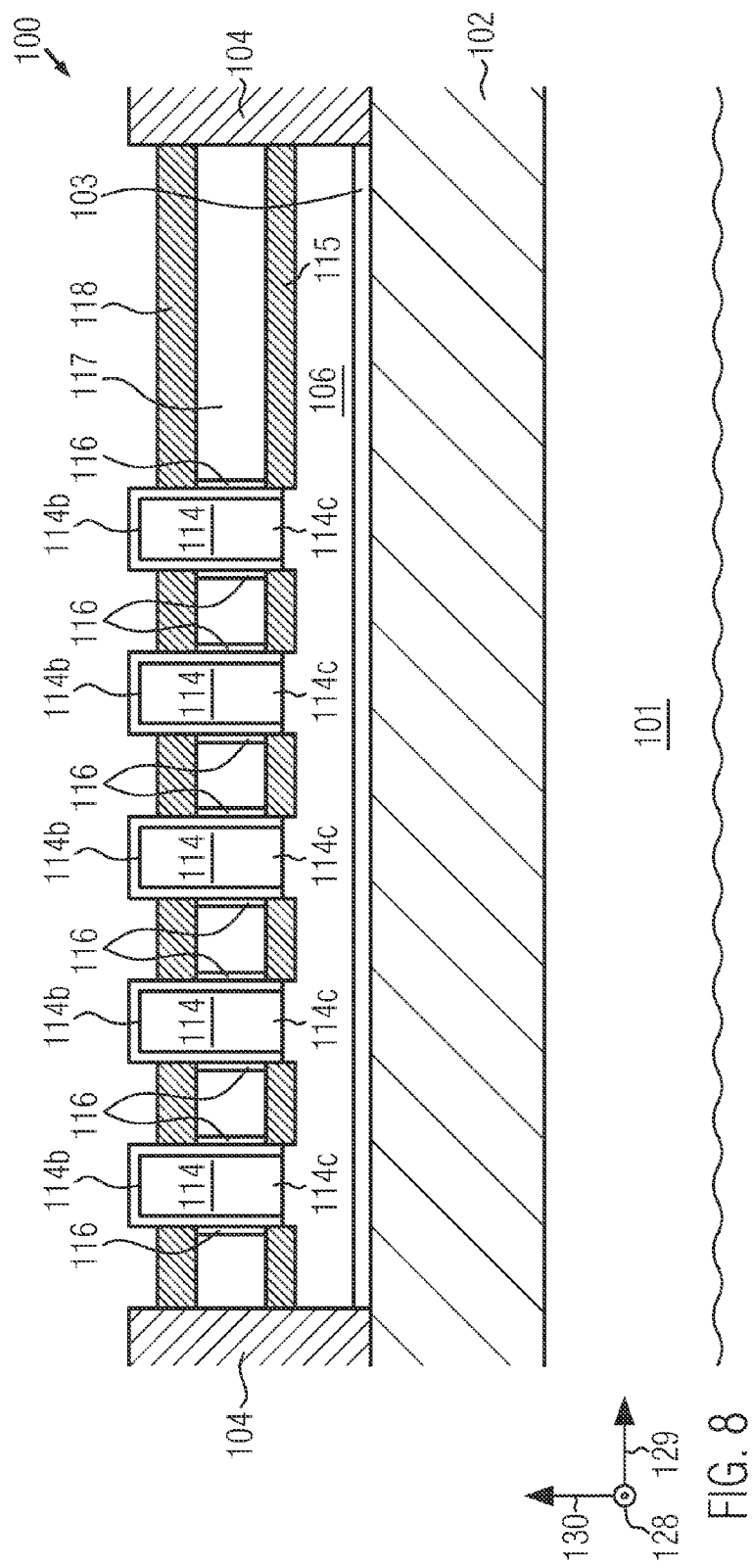
FIG. 8 shows a schematic cross-sectional view of a semiconductor structure in a stage of a method according to an example of the present disclosure.

FIG. 8 shows a schematic cross-sectional view of the semiconductor structure 100 in a later stage of the manufacturing process. After the formation of the gate insulation layer 116, a gate electrode 117 may be formed over the semiconductor structure 100.

The gate electrode 117 may include a metal. The metal of the gate electrode 117 may be selected for adapting a work function of the gate electrode 117 to a work function of the semiconductor material of the nanowires 114. The material of the gate electrode 117 may be selected depending on whether the transistor to be formed in the semiconductor structure 100 is a P-channel transistor or an N-channel transistor. In embodiments wherein an N-channel transistor is to be formed and wherein the portion 106 of the semiconductor layer 105 includes an N-type dopant, the metal of the gate electrode 117 may include La, LaN or TiN. In embodiments wherein a P-channel transistor is to be formed and wherein the portion 106 of the semiconductor layer 105 is P-doped, the metal of the gate electrode 117 may include Al, AlN or TiN. In further embodiments, the gate electrode 117 may be formed of a semiconductor material, for example polysilicon.

Similar to the drain spacer 115, the gate electrode 117 may be formed by anisotropically depositing a layer of the material of the gate electrode 117 over the semiconductor structure 100 and performing an isotropic etch process to remove portions of the layer of the material of the gate electrode 117 on sidewalls and top surfaces of the nanowires 114 and the trench isolation structure 104. The gate electrode 117 covers a surface of the drain spacer 115, wherein the nanowires 114 and the gate insulation layer 116 extend through openings in the gate electrode 117. Thus, the gate electrode 117 annularly encloses each of the nanowires 114.

After the formation of the gate electrode 117, portions of the gate insulation layer 116 that are not covered by the gate electrode 117 may be removed by means of an etch process. In embodiments wherein the gate insulation layer 116 includes silicon dioxide, this may be done by means of a wet etch cleaning process wherein the semiconductor structure 100 is exposed to diluted hydrofluoric acid.

Thereafter, a source spacer 118 may be formed. Similar to the drain spacer 115, the source spacer 118 may be formed of silicon dioxide, and techniques for forming the source spacer 118 may correspond to techniques employed in the formation of the drain spacer 115. In particular, the formation of the source spacer 118 may include an anisotropic deposition of a layer of the material of the source spacer 118 and an isotropic etch process. The anisotropic deposition process may be a high density plasma chemical vapor deposition process and the isotropic etch process may be a dry etch process.

The thickness of the source spacer 118 need not be substantially equal to a thickness of the drain spacer 115. In some embodiments, the source spacer 118 may have a greater thickness than the drain spacer 115. Thus, on the source side of the nanowires 114, more space may be provided for forming a source contact of the transistor to be formed in the semiconductor structure 100. For example, in some embodiments, the thickness of the source spacer 118 may be about twice the thickness of the drain spacer 115.

Figure 9:
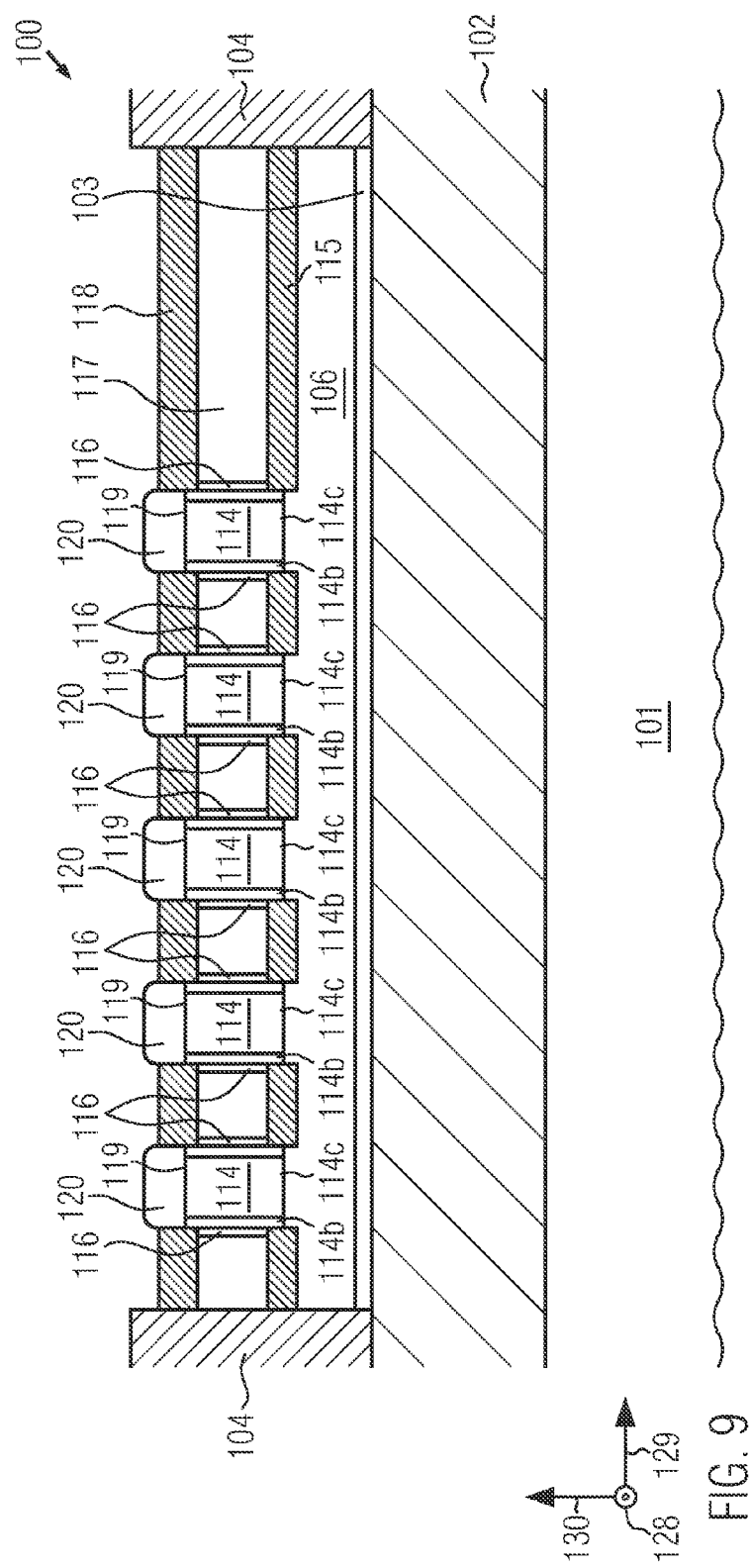
FIG. 9 shows a schematic cross-sectional view of a semiconductor structure in a stage of a method according to an example of the present disclosure.

FIG. 9 shows a schematic cross-sectional view of the semiconductor structure 100 in a later stage of the manufacturing process. After the formation of the source spacer 118, an etch process adapted to selectively remove the material of the nanowires 114 relative to the materials of the source spacer 118 and the trench isolation structure 104 may be performed. In embodiments wherein the source spacer 118 and the trench isolation structure 104 include silicon dioxide and the nanowires 114 include silicon, the etch process may be an isotropic etch process adapted to selectively etch silicon relative to silicon dioxide.

In the etch process, an upper part of each of the nanowires 114 (upper part of both the cores 114c and the shells 114b) is removed. Another part of each of the nanowires 114 remains in the semiconductor structure 100. In FIG. 9, reference numeral 119 denotes distal ends of the parts of the nanowires 114 that remain in the semiconductor structure 100 after the etch process. The distal ends 119 of the parts of the nanowires 114 remaining in the semiconductor structure 100 after the etch process may be closer to the substrate 101 than the horizontal top surface of the source spacer 118. Thus, after the etch process, a recess is provided at the location of each of the nanowires 114, wherein the distal ends 119 of the nanowires 114 are exposed at the bottoms of the recesses and sidewalls of the recesses are formed by the source spacer 118.

After the etch process, the recesses may be filled with a semiconductor material 120. The semiconductor material 120 may include the same semiconductor material as the nanowires 114. For example, in embodiments wherein the nanowires 114 include silicon, the semiconductor material 120 may also include silicon. However, a doping of the semiconductor material 120 may be different from a doping of portions of the nanowires 114 adjacent the semiconductor material 120 that have been formed from the portion 107 of the semiconductor layer 105.

A type of dopant in the semiconductor material 120 may be the same as the type of dopant in the portion 106 of the semiconductor layer 105. In particular, in embodiments wherein an N-channel transistor is to be formed in the semiconductor structure 100, the portion 106 of the semiconductor layer 105 as well as the semiconductor material 120 may be P-doped. In embodiments wherein a P-channel transistor is to be formed in the semiconductor structure 100, the portion 106 of the semiconductor layer 105 and the semiconductor material 120 may include N-type dopants. In some embodiments wherein the semiconductor material 120 is N-doped, the semiconductor material 120 may include arsenic at a dopant concentration in a range from about $10^{15}$ cm$^{-3}$ to about $10^{21}$ cm$^{-3}$ (solid solubility limit), for example a concentration of about $10^{21}$ cm$^{-3}$. The dopant concentration in the semiconductor material 120 may be greater than the dopant concentration in the portion 106 of the semiconductor layer 105. The portion 106 of the semiconductor layer 105 may receive a higher thermal budget, and its dopants may show more diffusion into the portion 107 of the semiconductor layer 105.

As will be detailed below, a drain region of a transistor to be formed in the semiconductor structure 100 may be formed from the portion 106 of the semiconductor layer 105, a channel region may be formed from portion 107, and a source region may be formed from the semiconductor material 120. Providing a lower dopant concentration in the portion 106 of the semiconductor layer 105 may help to avoid or at least reduce dopants floating in the channel region.

Source regions with less thermal budget may be produced with a doping of $10^{21}$ cm$^{-3}$ (solid solubility limit) to receive the best source resistance. A low drain resistance may be provided by providing a relatively thick portion 106 of the semiconductor layer 105 from which the drain region is formed.

In embodiments wherein the semiconductor material 120 is P-doped, the semiconductor material 120 may include boron at a concentration in a range from about $10^{19}$ cm$^{-3}$ to about $10^{21}$ cm$^{-3}$, for example at a concentration of about $10^{20}$ cm$^{-3}$.

The semiconductor material 120 may be deposited by means of a selective epitaxial growth process, for example chemical vapor deposition process, a plasma enhanced chemical vapor deposition process, a molecular beam epitaxy process or a metal organic chemical vapor deposition process, as described above in the context of the formation of the semiconductor layer 105. Thus, in the deposition of the semiconductor material 120, substantially no semiconductor material or only a small amount of semiconductor material is deposited on the surface of the source spacer 118 and the trench isolation structure 104. The semiconductor material 120 may have a thickness in a range from about 5-15 nm, for example a thickness of about 10 nm.

The semiconductor material 120 may be in situ doped. For this purpose, a dopant or a chemical compound comprising a dopant may be supplied during the deposition of the semiconductor material 120.

After the deposition of the semiconductor material 120, an annealing process may be performed. The annealing process may activate dopants in the semiconductor material 120. Moreover, the annealing process may cause some diffusion of dopants from the semiconductor material 120, so that a smoother transition between the doping of the semiconductor material 120 and the adjacent portions of the nanowires 114 formed from the portion 107 of the semiconductor layer 105 is obtained.

The annealing process may employ a combination of a rapid thermal annealing (RTA) process and a laser spike annealing (LSA) process, wherein the rapid thermal annealing process may be performed for about 5 seconds at a temperature of about 920° C., and the laser spike annealing process may be performed for about 0.002 seconds at a temperature of about 1225° C.

It is noted that, after the deposition of the semiconductor material, a source contact layer may be formed. The source contact layer may include a silicide. For forming the source contact layer, a silicon layer, for example a layer of polysilicon, may be formed over the semiconductor structure 100. Thereafter, a layer of a metal, for example a layer of nickel, tungsten and/or titanium, may be deposited on the silicon layer. Thereafter, an annealing process, for example a rapid thermal annealing process, may be performed for initiating a chemical reaction between the metal and the silicon. In the chemical reaction, silicide is formed. In addition to the material of the silicon layer deposited over the semiconductor structure 100, a part of the semiconductor material 120 may also react with the metal and form a silicide. Thus, an interface between silicide and doped semiconductor material may be provided more closely to the substrate 101 than the surface of the semiconductor material 120 that is obtained directly after the deposition of the semiconductor material 120. However, a portion of non-reacted doped semiconductor material 120 may remain on the nanowires 114, so that there is a transition between differently doped semiconductor materials at the distal ends 119 of the nanowires 114.

After the annealing process is performed for forming silicide, excess metal may be removed by means of a cleaning process.

After the formation of the source contact layer, the semiconductor structure 100 includes a transistor. The portion 106 of the semiconductor layer 105 below the nanowires 114 forms a drain of the transistor. Portions of the nanowires 114 that have been formed from the portion 107 of the semiconductor layer 105 provide a channel region of the transistor and a source of the transistor is provided by the semiconductor material 120 and the source contact layer.

The transistor may be switched between an electrically conductive on-state and an off-state having only a relatively low electrical conductivity by applying an electric voltage to the gate electrode 117. The gate electrode 117 is electrically insulated from the channel region in the nanowires 114 by the gate insulation layer 116, and is isolated from the drain region and the source region by the drain spacer 115 and the source spacer 118, respectively. Since the channel region of the transistor is provided in the nanowires 114, and the gate electrode 117 annularly encloses the nanowires 114, the gate electrode 117 extends all around the channel region, which may improve the controllability of the channel that is obtainable by applying a voltage to the gate electrode 117.

An interface between the doped semiconductor material in the drain of the transistor and the substantially undoped or inversely doped semiconductor material in the channel of the transistor is provided by the interface between the portions 106 and 107 of the semiconductor layer 105. An interface between the doped semiconductor material in the source of the transistor and the substantially undoped or inversely doped semiconductor material in the channel region is provided by the interface between the semiconductor material 120 and the nanowires 114.

The location of the interface between the source region and the channel region of the transistor relative to the gate electrode 117 may be controlled by selecting the thickness of the source spacer 118 and the amount of semiconductor material that is removed in the etching of the nanowires 114 that is performed after the formation of the source spacer 118. Thus, the location of the interface between the channel region and the source region may be relatively precisely controlled.

In the above-described embodiment, a source or drain was formed in a semiconductor layer below the nanowire. The nanowire was doped according to the requirements of an N-channel or P-channel FET. A source or drain was formed in semiconductor material replacing an upper part of the nanowire. According to the embodiment described below with reference to FIGS. 10a-10g, the nanowire is directly formed from differently doped semiconductor layers. Thus, a channel region and one of a source or drain region are formed without the need for replacing part of the formed nanowire with doped semiconductor material, thereby somewhat simplifying the overall manufacturing process.

Figure 10A:
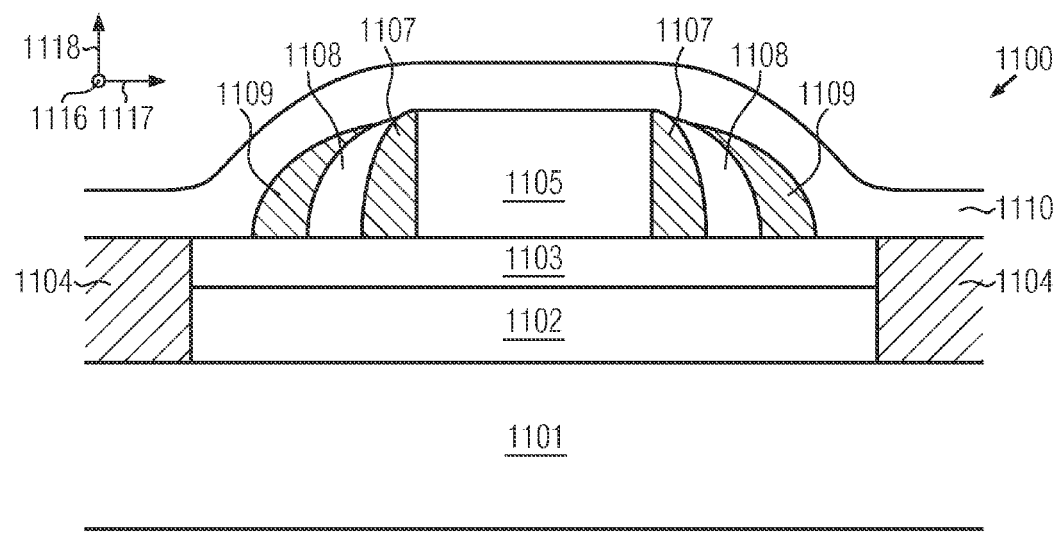
FIGS. 10a-10g show schematic views of a semiconductor structure in a stage of a method according to an alternative example of the present disclosure.

FIG. 10a shows a semiconductor structure 1100 wherein a first semiconductor layer 1102 and a second semiconductor layer 1103 are formed on a semiconductor substrate 1101. The semiconductor substrate 1101 may be a silicon substrate. At least in the region adjacent to the first semiconductor layer 1102, the semiconductor substrate 1101 is doped with a first type of dopants. The first semiconductor layer 1102 is doped with a second type of dopants (i.e., inversely doped with respect to the semiconductor substrate 1101). The second semiconductor layer 1103 is doped with the first type of dopants.

Furthermore, the structure 1100 comprises shallow trench isolations 1104 that may electrically isolate parts of the semiconductor layers 1102 and 1103. A dummy element 1105 is formed on the second semiconductor layer 1103. The dummy element 1105 may have an elongated shape with a dimension in the first direction 1116 larger than a dimension in the second direction 1117. The width of the dummy element 1105 in the second direction 1117 may correspond to the resolution of a photolithography process/device used for the formation of the dummy element 1105. As shown in FIG. 10a, the first and second direction 1116 and 1117 are perpendicular to a thickness direction 1118 of the structure 1100. Similar to the embodiment described with reference to FIGS. 1a-9, a plurality of alternating spacer elements of a first kind of material 1107, 1109 and one or more spacer elements of a second kind of material 1108 are formed at sides of the dummy element 1105 and on the second semiconductor layer 1103. The spacer elements 1107, 1108 and 1109 are formed from corresponding spacer layers that are deposited on the second semiconductor layer 1103 and etched appropriately. The first kind of material may comprise or consist of silicon nitride and the second kind of material may comprise or consist of silicon dioxide or vice versa. A material layer 1110 is formed over the dummy element 1105 and the spacer elements 1107, 1108, 1109 and may be made of the material of the dummy element 1105 and the spacer element 1108. The material layer 1110 may be formed by chemical vapor deposition or plasma enhanced chemical deposition, for example.

Figure 10B:
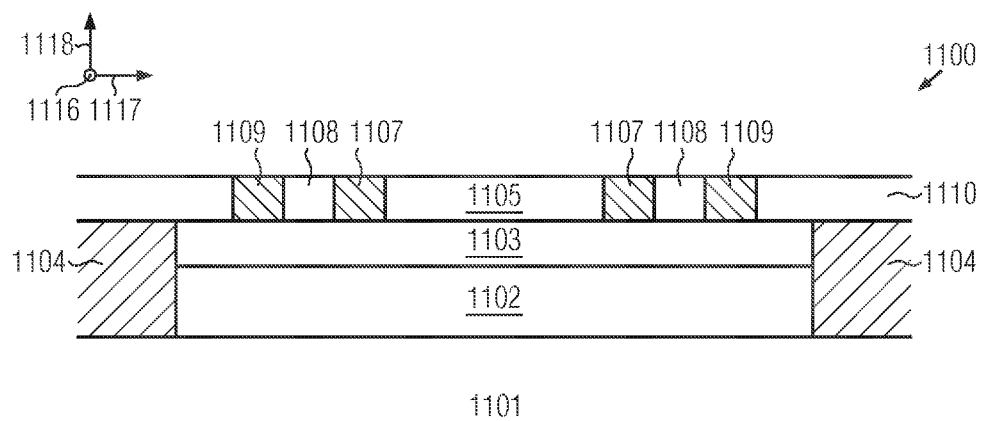

FIG. 10b shows the structure 1100 in a further developed processing stage. Planarization, for example, chemical mechanical polishing, is performed, thereby removing the part of the material layer 1110 formed on the dummy element 1105 and the spacer elements 1107, 1108, 1109. Parts of the dummy element 1105 and the spacer elements 1107, 1108, 1109 are also removed to achieve a flat surface of the semiconductor structure 1100. After planarization, the remaining part of the dummy element 1105 is enclosed by the remaining parts of the spacer elements 1107, 1108, 1109 that in turn are enclosed by the remaining part of the material layer 1110.

Figure 10C:
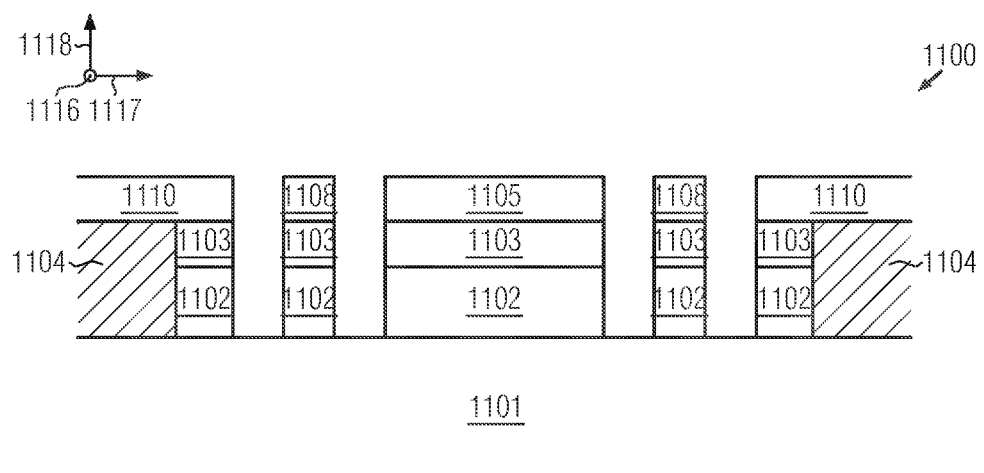

FIG. 10c shows the structure 1100 in a further developed processing stage. The remaining parts of the spacer elements 1107 and 1109 are removed to expose parts of the second semiconductor layer 1103. Removal of the remaining parts of the spacer elements 1107 and 1109 may be achieved by selectively (with respect to the material of the dummy element 1105 and the material of the spacer element 1108) etching the material of the remaining spacer elements 1107 and 1109. After removal of the remaining parts of the spacer elements 1107 and 1109, the exposed parts of the second semiconductor layer 1103 are (anisotropically) etched selectively to the materials of the dummy element 1105, spacer element 1108 and material layer 1110. The etching may also remove parts of the first semiconductor layer 1102 and is stopped at the surface of the semiconductor substrate 1101. In principle, the etching may be stopped before the surface of the semiconductor substrate 1101 is exposed or it may be carried out until some part of the semiconductor substrate 1101 is also removed. However, as a result, trenches extending in the first direction 1116 are formed within the region of the structure 1100 that is defined by the shallow trench isolations 1104. The trenches achieved by removal of the parts of the first and second semiconductor layers 1102 and 1103 have widths corresponding to the widths of the remaining (and removed) spacer elements 1107 and 1109. The widths of the remaining (and removed) spacer elements 1107 and 1109 depend on the thickness of the spacer layers from which the spacer elements are formed and the degree of anisotropy of the etching process used in forming the spacer elements from the deposited spacer layers. Since these characteristics, in particular, the thickness of the spacer layer, are not influenced by photolithographic limitations, the trenches may exhibit widths below any photolithographic resolution. Particularly, the widths of the trenches (in the direction 1117) may lie in the range of 5-20 nm.

Figure 10D:
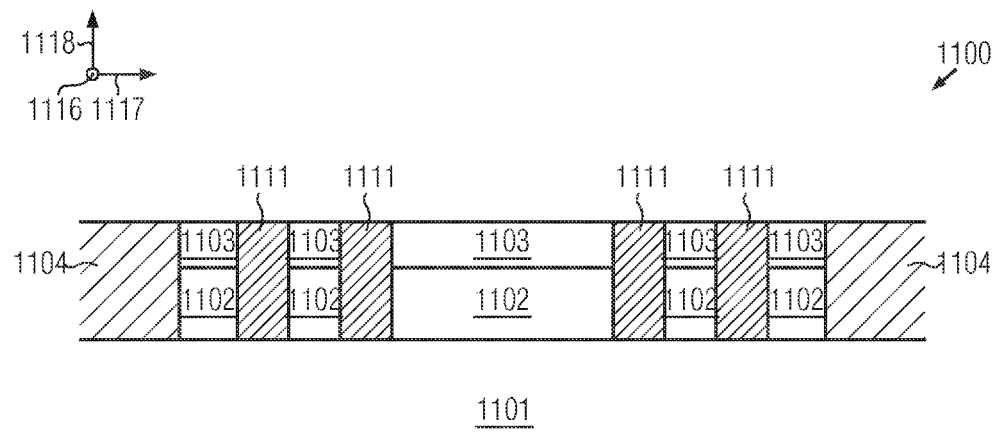

In a next processing step, the remaining parts of the spacer element 1108, the dummy element 1105 and material layer 1110 may be removed and the trenches may be filled with filling material 1111 (see FIG. 10d). Chemical mechanical polishing may be performed to remove filling material outside the filled trenches.

Figure 10F:
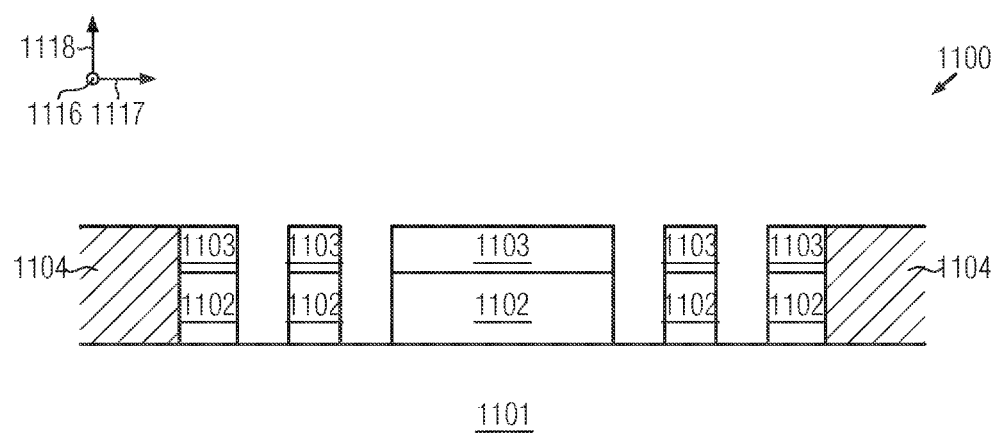
Figure 10E:
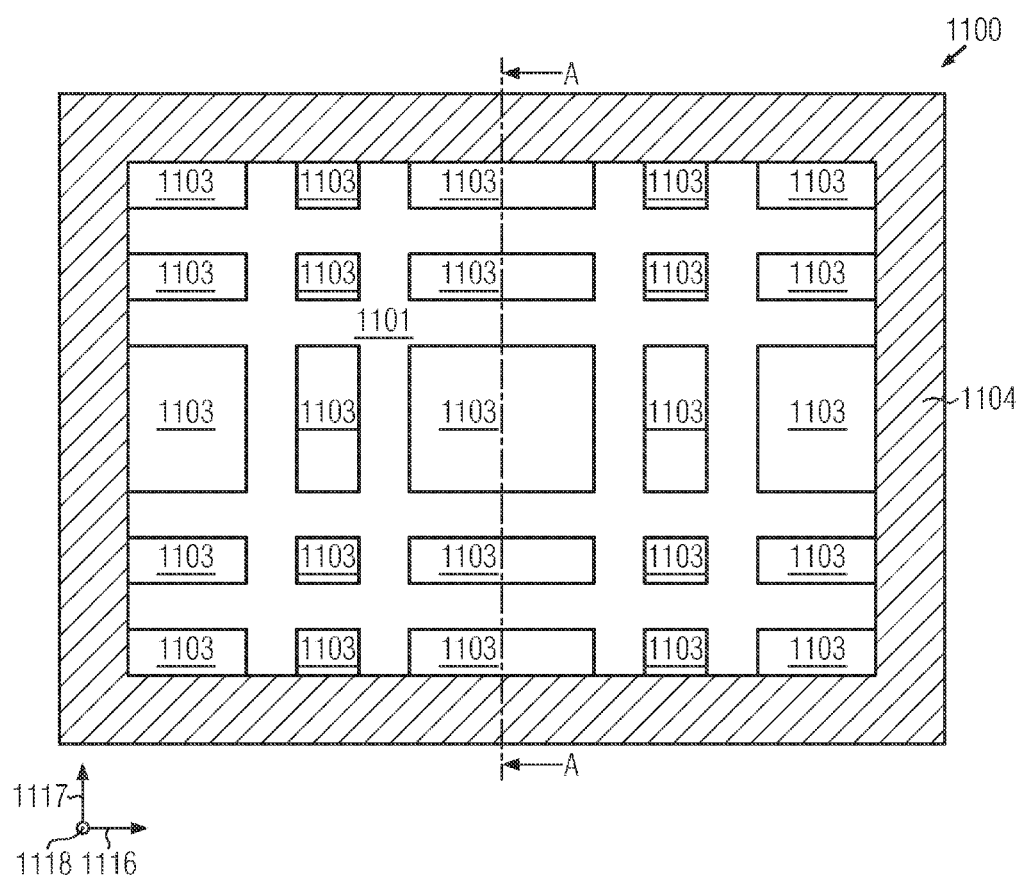

FIGS. 10e and 10f show the structure 1100 in a further developed stage. FIG. 10e shows a plan view and FIG. 10f a cross-section along line A-A of FIG. 10e. These figures illustrate the result of a further structuring process carried out for the region enclosed by the STIs 1104. In this further structuring process, another dummy element similar to the dummy element 1105 described above may be formed over the semiconductor structure 1100. This other dummy element may exhibit an elongated shape with a width given by a photolithographic resolution of a photolithographic device used for the formation of the other dummy element. Different from dummy element 1105, the longitudinal direction of the other dummy element is parallel to the second direction 1117 and the width direction of the other dummy element is parallel to the first direction 1116. Further structuring steps are performed similar to the ones described with reference to FIGS. 10a-10c. Thus, further trenches are formed in the first and second semiconductor layers 1102 and 1103 after formation and selective removal of spacer elements formed aside the other dummy element and selective removal of the thereby exposed parts of the first and second semiconductor layers 1102 and 1103. Whereas the trenches filled by the filling material 1111 (see FIG. 10d) run in the first direction 1116, the trenches formed by the second structuring process run in the second direction 1117.

After removal of the filling material 1111, nanowires formed from the first and second semiconductor layers 1102 and 1103 and extending in the vertical direction 1118 result, as it is shown in FIGS. 10e and 10f. The nanowires comprise upper parts 1103 doped with the same type of dopants as used for doping the upper part of the semiconductor substrate 1101. The nanowires comprise lower parts 1102 doped inversely as compared to the upper parts.

According to the present disclosure, performance of a semiconductor device formed based on nanowires is improved by providing nanowires with strained outer layers (shells). Particularly, the nanowires may provide channel regions for transistor devices. In this case, tensile stress in the nanowire core may enhance electron mobility in an N-channel FET, whereas compressive stress in the nanowire core may enhance hole mobility in a P-channel FET. Similar to the process shown in FIG. 6c, an etching process may be performed to remove parts at outer edges of the nanowires illustrated in FIGS. 10e and 10f. Again, the etching process may be an isotropic etching removing at least nanowire material of a thickness of 1 nm, particularly, at least 2 nm or 2.2 nm, at the outer edges of the nanowires. The remaining nanowire material forms the core of the eventually resulting nanowires. During an epitaxial deposition process, material of the thickness of the previously removed nanowire material (or a different thickness) is deposited to form shells of a strained material of the nanowires. The strained material may be properly doped. For example, a material comprising or consisting of SiGe may deposited in the deposition process. The SiGe material may comprise at least 20%, in particular at least 30%, Ge resulting in a (biaxial) compressive stress in the shells and a (biaxial) tensile stress in the cores of the resulting nanowires.

Figure 10G:
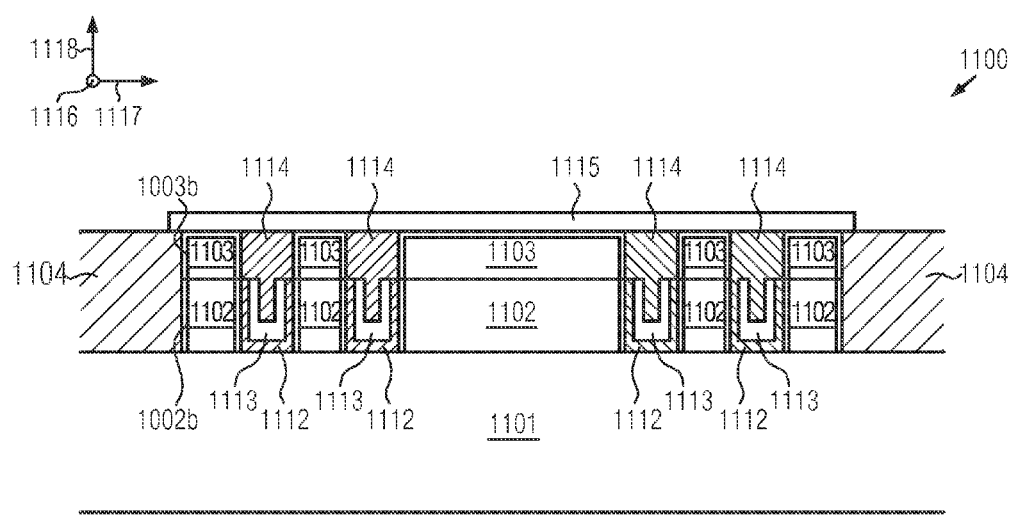

FIG. 10g shows the semiconductor structure in a further developed manufacturing stage. The nanowires comprise material of the first and second semiconductor layers 1102 and 1103 as cores and shells 1002b, 1003b (where the reference signs denote lower and upper parts of the shells, respectively) made of the epitaxially deposited material. A gate isolation layer 1112 is deposited in the trenches. The gate isolation layer 1112 may have a thickness of below 5 nm, for example, 2 nm. Subsequently, a gate electrode 1113 is formed. The formation of the gate electrode 1113 may be achieved by depositing an electrically conductive material, for example, a metal, such as Al, or a semiconductor material, such as polysilicon. Moreover, the gate electrode 1113 may comprise a metal component for adjusting the work function. The thickness of this metal component may be comparable to the gate length. Subsequently, the trenches may be completely filled with an isolation material 1114 and a drain electrode 1115 may be formed for contacting the upper parts of the nanowires.

As a result and as it was described with reference to the accompanying figures, the present disclosure provides a semiconductor device comprising a nanowire FET wherein performance of the nanowire FET is significantly enhanced by a strained material shell.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the invention. Accordingly, the protection sought herein is as set forth in the claims below.

What is claimed:

1. A method of forming a semiconductor device, comprising:
    providing a semiconductor substrate having an upper surface;
    forming a nanowire of a semiconductor material over said semiconductor substrate, wherein said nanowire has a length that is oriented in a vertical direction that is substantially perpendicular to said upper surface of said semiconductor substrate, said nanowire comprising first and second sides extending in said vertical length direction, wherein said first side has a first width that is oriented in a first horizontal direction that is substantially parallel to said upper surface and said second side has a second width that is oriented in a second horizontal direction that is substantially parallel to said upper surface and substantially perpendicular to said first horizontal direction, said nanowire length being greater than each of said first and second nanowire widths;
    removing part of said semiconductor material of said nanowire; and
    after removing said part of said semiconductor material, coating the remaining nanowire with a material exhibiting compressive or tensile stress.

2. The method of claim 1, wherein said nanowire length is at least approximately two times greater than each of said first and second nanowire widths.

3. The method of claim 2, wherein coating said remaining nanowire with said material exhibiting compressive or tensile stress comprises forming a stressed nanowire shell, said stressed nanowire shell continuously covering substantially an entirety of said nanowire core.

4. The method of claim 3, wherein said remaining nanowire resulting from said removal of said part of said semiconductor material is comprised of silicon and said material exhibiting compressive or tensile stress is comprised of silicon-germanium having at least 20% germanium.

5. The method of claim 4, further comprising forming a gate insulation layer annularly around said nanowire comprising said material exhibiting compressive or tensile stress and forming a gate electrode on said gate insulation layer.

6. The method of claim 5, wherein said nanowire comprises a near end positioned close to said semiconductor substrate and a distal end positioned opposite said near end along said vertical length direction of said nanowire and said method further comprises replacing part of said semiconductor material at said distal end with a semiconductor material that is inversely doped with respect to the remaining semiconductor material of said nanowire.

7. The method of claim 6, wherein said semiconductor substrate is an SOI substrate comprising a first semiconductor layer formed on an oxide layer and wherein forming said nanowire comprises:
    forming a second doped semiconductor layer on said first semiconductor layer;
    forming a third semiconductor layer on said second doped semiconductor layer, wherein said third doped semiconductor layer is undoped or inversely doped with respect to said second doped semiconductor layer;
    forming a structure above said third semiconductor layer, wherein forming said structure comprises:
        forming a dummy element of a first material above said third semiconductor layer; and
        forming a plurality of spacer elements on at least both sides of said dummy element, wherein said plurality of spacer elements comprises spacer elements of said first material and spacer elements of a second material different from said first material in an alternating manner;
    planarizing said formed structure, thereby obtaining a planarized dummy element and planarized spacer elements of said first and second material;
    removing said planarized spacer elements of said second material; and
    etching the portions of said third semiconductor layer exposed by the removal of said planarized spacer elements of said second material and part of said second doped semiconductor layer using said planarized dummy element and planarized spacer elements of said first material as an etch mask.

8. The method of claim 1, wherein said semiconductor device comprises a FET and said nanowire comprises a channel of said FET.

9. The method of claim 1, wherein said semiconductor substrate comprises a first doped semiconductor layer and wherein forming said nanowire comprises:
    forming a second doped semiconductor layer on said first doped semiconductor layer, wherein said second doped semiconductor layer is inversely doped with respect to said first doped semiconductor layer;
    forming a third doped semiconductor layer on said second doped semiconductor layer, wherein said third doped semiconductor layer is inversely doped with respect to said second doped semiconductor layer;
    forming a structure above said third semiconductor layer, wherein forming said structure comprises:
        forming a dummy element above said third doped semiconductor layer; and
        forming a plurality of spacer elements on at least both sides of said dummy element, wherein said plurality of spacer elements comprises spacer elements of said first material and spacer elements of a second material different from said first material in an alternating manner;
    planarizing said formed structure, thereby obtaining a planarized dummy element and planarized spacer elements of said first and second material;
    removing said planarized spacer elements of said second material; and
    etching the portions of said third doped semiconductor layer exposed by the removal of said planarized spacer elements of said second material and part of said second doped semiconductor layer using said planarized dummy element and planarized spacer elements of said first material as an etch mask.

10. The method of claim 1, wherein removing said part of said semiconductor material of said nanowire comprises performing an etching process to remove a thickness portion from each sidewall of said nanowire so as to form a nanowire core, said nanowire core comprising said remaining nanowire.

11. A method of forming a FET semiconductor device, comprising:
   providing a semiconductor substrate having an upper surface;
   forming a nanowire of a semiconductor material over said semiconductor substrate, wherein said nanowire comprises a channel of said FET, wherein a length of said nanowire is oriented in a vertical direction that is substantially perpendicular to said upper surface of said semiconductor substrate, and wherein a channel length of said FET is substantially aligned with said length of said nanowire, said nanowire having a near end positioned close to said semiconductor substrate and a distal end positioned opposite said near end along said vertical length direction of said nanowire;
   removing part of said semiconductor material of said nanowire;
   after removing said part of said semiconductor material, coating the remaining nanowire with a material exhibiting compressive or tensile stress, wherein said remaining nanowire is comprised of silicon and said material exhibiting compressive or tensile stress is comprised of silicon-germanium having at least 20% germanium; and
   replacing part of said semiconductor material at said distal end with a semiconductor material that is inversely doped with respect to the remaining semiconductor material of said nanowire.

12. The method of claim 11, further comprising forming a gate insulation layer annularly around said nanowire comprising said material exhibiting compressive or tensile stress and forming a gate electrode on said gate insulation layer.

13. The method of claim 11, wherein said semiconductor substrate is an SOI substrate comprising a first semiconductor layer formed on an oxide layer and wherein forming said nanowire comprises:
   forming a second doped semiconductor layer on said first semiconductor layer;
   forming a third semiconductor layer on said second doped semiconductor layer, wherein said third semiconductor layer is undoped or inversely doped with respect to said second doped semiconductor layer;
   forming a structure above said third semiconductor layer, wherein forming said structure comprises:
      forming a dummy element of a first material above said third semiconductor layer; and
      forming a plurality of spacer elements on at least both sides of said dummy element, wherein said plurality of spacer elements comprises spacer elements of said first material and spacer elements of a second material different from said first material in an alternating manner;
   planarizing said formed structure, thereby obtaining a planarized dummy element and planarized spacer elements of said first and second material;
   removing said planarized spacer elements of said second material; and
   etching the portions of said third semiconductor layer exposed by the removal of said planarized spacer elements of said second material and part of said second doped semiconductor layer using said planarized dummy element and planarized spacer elements of said first material as an etch mask.

14. The method of claim 11, wherein said semiconductor substrate comprises a first doped semiconductor layer and wherein forming said nanowire comprises:
   forming a second doped semiconductor layer on said first doped semiconductor layer, wherein said second doped semiconductor layer is inversely doped with respect to said first doped semiconductor layer;
   forming a third doped semiconductor layer on said second doped semiconductor layer, wherein said third doped semiconductor layer is inversely doped with respect to said second doped semiconductor layer;
   forming a structure above said third doped semiconductor layer, wherein forming said structure comprises:
      forming a dummy element above said third doped semiconductor layer; and
      forming a plurality of spacer elements on at least both sides of said dummy element, wherein said plurality of spacer elements comprises spacer elements of said first material and spacer elements of a second material different from said first material in an alternating manner;
   planarizing said formed structure, thereby obtaining a planarized dummy element and planarized spacer elements of said first and second material;
   removing said planarized spacer elements of said second material; and
   etching the portions of said third doped semiconductor layer exposed by the removal of said planarized spacer elements of said second material and part of said second doped semiconductor layer using said planarized dummy element and planarized spacer elements of said first material as an etch mask.

15. The method of claim 11, wherein said nanowire comprises a first side that extends in said vertical length direction and has a first width that is oriented in a first horizontal direction and a second side that extends in said vertical length direction and has a second width that is oriented in a second horizontal direction, each of said first and second horizontal directions being substantially parallel to said upper surface of said semiconductor substrate and said second horizontal direction being substantially perpendicular to said first horizontal direction, wherein said nanowire length is greater than each of said first and second nanowire widths.

16. The method of claim 11, wherein removing said part of said semiconductor material of said nanowire comprises performing an etching process to remove a thickness portion from each sidewall of said nanowire so as to form a nanowire core, said nanowire core comprising said remaining nanowire.

17. The method of claim 16, wherein coating said remaining nanowire with said material exhibiting compressive or tensile stress comprises forming a stressed nanowire shell, said stressed nanowire shell continuously covering substantially an entirety of said nanowire core.

18. A method of forming a semiconductor device, comprising:
   providing a semiconductor substrate;
   forming a nanowire of a semiconductor material over said semiconductor substrate, said nanowire comprising a near end positioned close to said semiconductor substrate and a distal end positioned opposite said near end along a longitudinal direction of said nanowire;
   removing part of said semiconductor material of said nanowire;

after removing said part of said semiconductor material, coating the remaining nanowire with a material exhibiting compressive or tensile stress; and replacing part of said semiconductor material at said distal end with a semiconductor material that is inversely doped with respect to the remaining semiconductor material of said nanowire.

19. A method of forming a semiconductor device, comprising:

providing a semiconductor substrate having an upper surface, said semiconductor substrate comprising a first doped semiconductor layer;

forming a nanowire of a semiconductor material over said semiconductor substrate, wherein said nanowire has a length that is oriented in a vertical direction that is substantially perpendicular to said upper surface of said semiconductor substrate, wherein forming said nanowire comprises:

forming a second doped semiconductor layer on said first doped semiconductor layer, wherein said second doped semiconductor layer is inversely doped with respect to said first doped semiconductor layer;

forming a third doped semiconductor layer on said second doped semiconductor layer, wherein said third doped semiconductor layer is inversely doped with respect to said second doped semiconductor layer;

forming a structure above said third semiconductor layer, wherein forming said structure comprises forming a dummy element of a first material above said third doped semiconductor layer and forming a plurality of spacer elements on at least both sides of said dummy element, said plurality of spacer elements comprising spacer elements of said first material and spacer elements of a second material different from said first material in an alternating manner;

planarizing said formed structure, thereby obtaining a planarized dummy element and planarized spacer elements of said first and second material;

removing said planarized spacer elements of said second material; and etching the portions of said third doped semiconductor layer exposed by the removal of said planarized spacer elements of said second material and part of said second doped semiconductor layer using said planarized dummy element and planarized spacer elements of said first material as an etch mask;

removing part of said semiconductor material of said nanowire; and after removing said part of said semiconductor material, coating the remaining nanowire with a material exhibiting compressive or tensile stress.

* * * * *